(12) United States Patent
Simolon

(10) Patent No.: US 11,894,855 B2
(45) Date of Patent: Feb. 6, 2024

(54) ANALOG-TO-DIGITAL CONVERTER CALIBRATION SYSTEMS AND METHODS

(71) Applicant: Teledyne FLIR Commercial Systems, Inc., Goleta, CA (US)

(72) Inventor: Brian B. Simolon, Santa Barbara, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 285 days.

(21) Appl. No.: 17/498,720

(22) Filed: Oct. 11, 2021

(65) Prior Publication Data

US 2023/0116433 A1 Apr. 13, 2023

(51) Int. Cl.
| | |
|---|---|
| *H03M 1/10* | (2006.01) |
| *H04N 25/617* | (2023.01) |
| *H04N 25/771* | (2023.01) |
| *H04N 25/772* | (2023.01) |

(52) U.S. Cl.
CPC ........ *H03M 1/1019* (2013.01); *H04N 25/617* (2023.01); *H04N 25/771* (2023.01); *H04N 25/772* (2023.01)

(58) Field of Classification Search
CPC ..... H03M 1/10; H04N 25/617; H04N 25/771; H04N 25/772
USPC ........................................................ 341/120
See application file for complete search history.

(56) References Cited

U.S. PATENT DOCUMENTS

| | | |
|---|---|---|
| 4,559,521 A | 12/1985 | Yada |
| 4,857,933 A | 8/1989 | Knight |
| 6,906,648 B1 | 6/2005 | Koike |
| 7,064,694 B1 | 6/2006 | Male et al. |
| 9,337,856 B1 | 5/2016 | Dhawan et al. |
| 11,283,459 B1* | 3/2022 | Monk ........................ G04F 5/04 |
| 2018/0167574 A1* | 6/2018 | Lee ....................... H04N 25/616 |

(Continued)

FOREIGN PATENT DOCUMENTS

WO WO2020142149 7/2020

OTHER PUBLICATIONS

Bergey, Jonathan et al, "Real-time Calibration of a 14-bit single Slope ADC with 290 MHz on-chip accelerated Ramp Generator for Column-Parallel Image Sensors", Forza Silicon Corporation, 4 pages, Pasadena/USA.

(Continued)

*Primary Examiner* — Lam T Mai
(74) *Attorney, Agent, or Firm* — Haynes and Boone, LLP

(57) ABSTRACT

Techniques for facilitating analog-to-digital converter calibrations are provided. In one example, a method includes, for each of a plurality of time instances, generating a first ramp signal started at the time instance relative to a respective start of a first counter signal and generating a respective comparator output signal based on the first ramp signal and a first threshold signal. The method further includes capturing a respective first value of the first ramp signal in response to a transition of the respective comparator output signal. The method further includes determining a respective second counter value of a second counter signal based on the respective first value. The method further includes determining a scaling factor based on the second counter values and the time instances. Each of the first values is associated with the same counter value of the first counter signal. Related devices and systems are also provided.

20 Claims, 11 Drawing Sheets

(56) References Cited

U.S. PATENT DOCUMENTS

| | | | | |
|---|---|---|---|---|
| 2023/0040963 A1* | 2/2023 | Hansen | | H04N 25/77 |
| 2023/0046320 A1* | 2/2023 | Crook | | G06T 5/50 |
| 2023/0048442 A1* | 2/2023 | Moreira | | H04N 25/671 |
| 2023/0116433 A1* | 4/2023 | Simolon | | H03M 1/1019 |
| | | | | 341/120 |
| 2023/0231567 A1* | 7/2023 | Monk | | G04F 5/04 |
| | | | | 327/156 |

OTHER PUBLICATIONS

Van De Plassche, Rudy, "CMOS Integrated Analog-To-Digital and Digital-To-Analog Converters", pp. 241-244, Kluwer Academic Publishers.

* cited by examiner

ANALOG-TO-DIGITAL CONVERTER CALIBRATION SYSTEMS AND METHODS

TECHNICAL FIELD

One or more embodiments relate generally to analog-to-digital conversion and more particularly, for example, to analog-to-digital converter calibration systems and methods.

BACKGROUND

Imaging systems may include an array of detectors arranged in rows and columns, with each detector functioning as a pixel to produce a portion of a two-dimensional image. For example, an individual detector of the array of detectors captures an associated pixel value. There are a wide variety of image detectors, such as visible-light image detectors, infrared image detectors, or other types of image detectors that may be provided in an image detector array for capturing an image. As an example, a plurality of sensors may be provided in an image detector array to detect electromagnetic (EM) radiation at desired wavelengths. In some cases, such as for infrared imaging, readout of image data captured by the detectors may be performed in a time-multiplexed manner by a readout integrated circuit (ROIC). The image data that is read out may be communicated to other circuitry, such as for processing, storage, and/or display. In some cases, a combination of a detector array and an ROIC may be referred to as a focal plane array (FPA). Advances in process technology for FPAs and image processing have led to increased capabilities and sophistication of resulting imaging systems.

SUMMARY

In one or more embodiments, a method includes, for each time instance of a plurality of time instances, generating a first ramp signal started at the time instance relative to a respective start of a first counter signal; generating a respective comparator output signal based on the first ramp signal and a first threshold signal, where the respective comparator output signal is associated with a first state or a second state; capturing a respective first value of the first ramp signal in response to a transition of the respective comparator output signal from the first state to the second state; and determining a respective second counter value of a second counter signal based on the respective first value. The method further includes determining a scaling factor based on the second counter values and the plurality of time instances. Each of the first values is associated with the same counter value of the first counter signal.

In one or more embodiments, a system includes an analog-to-digital converter and a logic device. The analog-to-digital converter is configured to, for each time instance of a plurality of time instances: generate a first ramp signal started at the time instance relative to a respective start of a first counter signal; generate a respective comparator output signal based on the first ramp signal and a first threshold signal, where the respective comparator output signal is associated with a first state or a second state; capture a respective first value of the first ramp signal in response to a transition of the respective comparator output signal from the first state to the second state; and determine a respective second counter value of a second counter signal based on the respective first value. The logic device is configured to determine a scaling factor based on the second counter values and the plurality of time instances. Each of the first values is associated with the same counter value of the first counter signal.

The scope of the present disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

Figure 1:
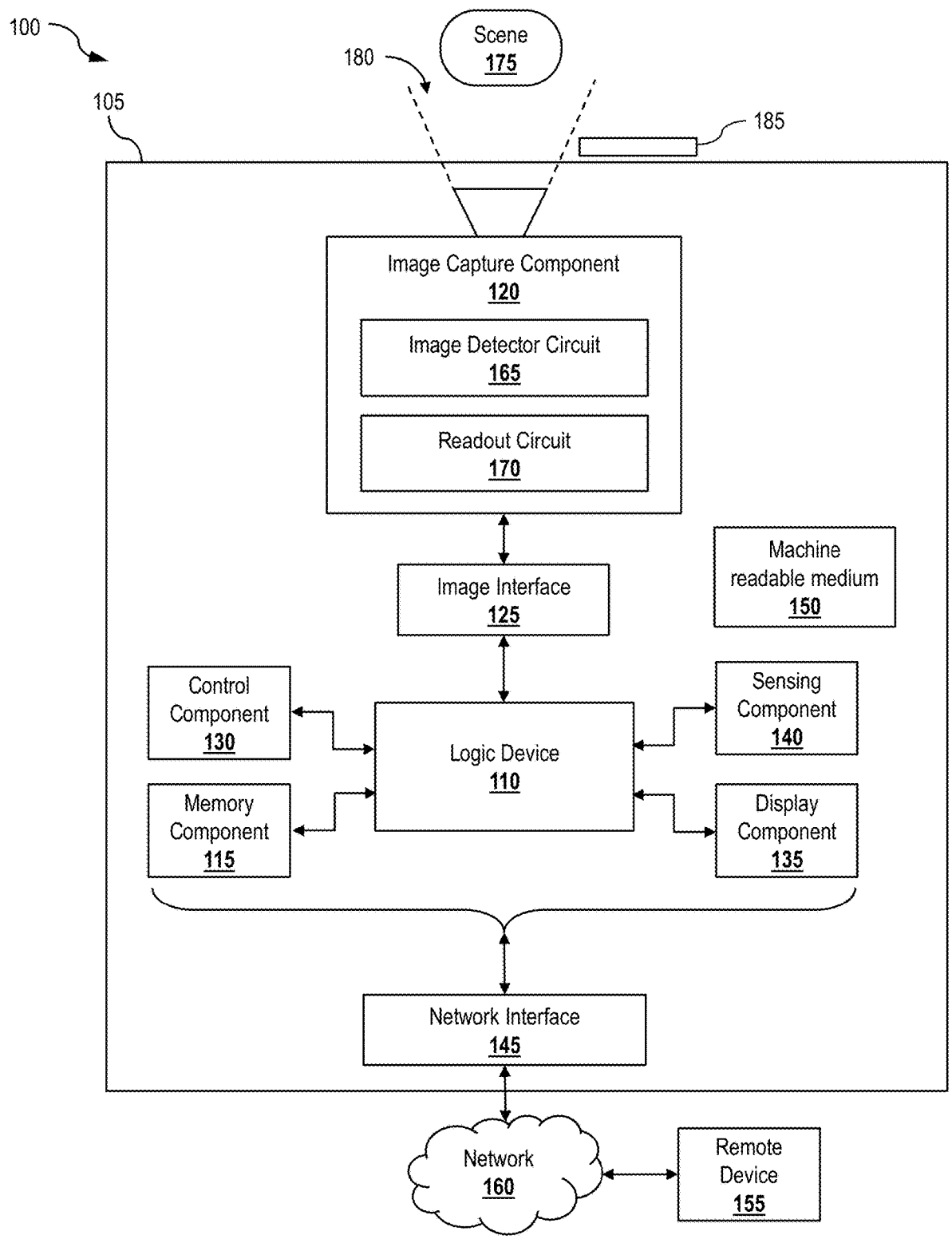
FIG. 1 illustrates a block diagram of an example imaging system in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various systems and methods are provided for facilitating analog-to-digital converter (ADC) calibration. The ADC may include integrators, comparators, counter circuits, and memory devices. The ADC may receive analog signals and generate digital representations of the analog signals. In some cases, the analog signals may include detector signals (e.g., detector voltages, detector currents) generated by detectors of an imaging system in response to incident EM radiation. Each comparator may generate a comparator output signal based on a reference signal and a comparator input signal associated with a respective detector signal (e.g., from a respective detector of the detector array). In some cases, the comparator input signal may be a signal output by an integrator. The reference signal may be generated by a reference generator. In some cases, the reference signal may be a fixed signal (e.g., a fixed voltage level). In an aspect, the integration output signal of the integrator may ramp (e.g., ramp up or ramp down) while, synchronously, a counter circuit begins adjusting (e.g., incrementing) a counter value (e.g., also referred to as a digital count value or simply a count value). The comparator output signal may be associated with a first state or a second state. For example, the comparator output signal may be associated with the first state when the reference signal does not exceed the integrator output signal and may be associated with the second state when the reference signal exceeds the integrator output signal, or vice versa.

In some embodiments, the ADC may be provided in an imaging system (e.g., infrared imaging system). The imaging system may include the ADC, a detector array, and a readout circuit. In some cases, the ADC may be implemented as part of the detector array or the readout circuit. The imaging system may be used to capture infrared image data associated with a scene using an image sensor device (e.g., a detector array of an FPA). The image sensor device includes detectors (e.g., also referred to as detector pixels, detector elements, or simply pixels). Each detector pixel may detect incident EM radiation and generate infrared image data indicative of the detected EM radiation of the scene. In some cases, the image sensor array is used to detect infrared radiation (e.g., thermal infrared radiation). For pixels of an infrared image (e.g., thermal infrared image), each output value of a pixel may be represented/provided as and/or correspond to a temperature, digital count value, percentage of a full temperature range, or generally any value that can be mapped to the temperature. For example, a digital count value of 13,000 output by a pixel may represent a temperature of 160° C. As such, the captured infrared image data may indicate or may be used to determine a temperature of objects, persons, and/or other features/aspects in the scene.

In some embodiments, the ADC is a multi-ranging ADC. In some aspects, multi-ranging ADCs may facilitate fast conversion of analog input signals. Figures of merit for an ADC may include monotonicity and differential non-linearity (DNL) with no missing or redundant codes. Appropriate calibration may be performed to allow the multiple ranges to be combined with accuracy such that a final/combined ADC output is monotonic and does not have any missing codes. A monotonic code with no missing codes may have a DNL between −1 and +1. In some cases, calibration may be performed off-chip from the ADC. The calibration may be performed to account for errors associated with the ramps used by the ADC to convert the analog input signals. Such errors may be associated with mismatches (e.g., gain factor mismatches) between the first ramp and the second ramp for a given column of the detector array and/or between different columns of the detector array.

In a two-ramp ADC (e.g., also referred to as a two-slope ADC), a first ramp may be swept through a signal range to determine a first set of bits (e.g., most significant bits (MSBs)) of a digital representation of an analog signal and then a second ramp may be swept to determine a second set of bits (e.g., least significant bits (LSBs)) of the digital representation. It is noted that each of the first and second ramps may be a linear ramp or a non-linear ramp. If a slope of these two ramps is not matched (e.g., the first ramp and/or the second ramp are not at their respective predetermined values), non-monotonicity (e.g., missing codes) may occur.

In some embodiments, calibration may be performed on the two-ramp ADC to determine a scaling factor (e.g., also referred to as a calibration factor) for applying to a count value (e.g., corresponding to MSBs) to correct for mismatch (e.g., gain mismatch) between the first ramp and the second ramp. Correcting for such mismatch may allow avoiding of redundant or missing codes. The calibration may be based on a relationship between a start of the first ramp and a start of a first counter. The start of the first ramp may be a time at which the first ramp starts to ramp up or ramp down dependent on application/implementation. The start of the first counter may be a time at which the first counter starts to increment or decrement dependent on application/implementation. Due to mismatch between columns of the detector array, calibrations may be performed to determine a respective scaling factor for each column.

As an example of effects of mismatches, a 14-bit two-ramp ADC may be considered. The 14-bit two-ramp ADC may digitize an analog input signal to a 14-bit output with five bits of the 14-bit output forming MSBs associated with a digital representation of the analog input signal and the remaining nine bits forming LSBs associated with the digital representation. The MSBs may correspond to an MSB count value, denoted by $MSB_{raw}$, and the LSBs may correspond to an LSB count value, denoted by $LSB_{raw}$. A total count value $S_{ADC}$ (e.g., also referred to as an ADC conversion value) provides the digital representation of the analog signal and is determined based on the MSB count value and the LSB count value. A nominal scaling factor applied to the MSB count value is 512, since each MSB count has a weight of 512 LSB counts. As such, the total count value $S_{ADC}$ may be provided by $S_{ADC} = MSB_{raw} \times 512 + LSB_{raw}$.

In some aspects, the LSBs have an extra bit (e.g., a fifteenth bit output by the ADC) for redundancy to account for errors associated with the first ramp and/or the second ramp and/or errors (e.g., mismatch) between the two ramps. For example, if a slope of the second ramp is 10% lower than a nominal/expected slope of the second ramp (e.g., the slope the second ramp is designed to have), each LSB count essentially covers a smaller step than the expected slope of the second ramp. In this regard, instead of the second ramp covering 512 counts (e.g., from the nine bits), the second ramp may instead cover 512×1.1=563 counts. This value of 563, which is larger than 512, is achievable since the LSBs have the extra bit for redundancy that allows for a total raw LSB output of up to 1,024. With the value 563 and the equation $S_{ADC}=MSB_{raw}\times 512+LSB_{raw}$, redundant counts may occur, for example, if $MSB_{raw}=0$ and $LSB_{raw}=563$ or $MSB_{raw}=1$ and $LSB_{raw}=51$. Both of these combinations of $MSB_{raw}$ and $LSB_{raw}$ result in the same count value of 563 when the equation $MSB_{raw}\times 512+LSB_{raw}=S_{ADC}$ is used.

The calibration may be performed to determine that the scaling factor for $MSB_{raw}$ is 564 (e.g., rather than the nominal 512). With such calibration, a total count value may be provided by $MSB_{raw}\times 564+LSB_{raw}$. With $MSB_{raw}=0$ and $LSB_{raw}=563$, the total count value is 563. With $MSB_{raw}=1$ and $LSB_{raw}=51$, the total count value is 615. As such, these two combinations of $MSB_{raw}$ and $LSB_{raw}$ are no longer redundant codes. As another example, if the LSB count $LSB_{raw}=0$ when the MSB count $MSB_{raw}$ transitions to 1, the total count value is 564 and thus there are no redundant or missing codes.

Calibration using methods and systems disclosed herein may be utilized in conjunction with devices and systems such as infrared imaging systems, visible-light imaging systems, imaging systems having visible-light and infrared imaging capability, short-wave infrared (SWIR) imaging systems, light detection and ranging (LIDAR) imaging systems, radar detection and ranging (RADAR) imaging systems, millimeter wavelength (MMW) imaging systems, ultrasonic imaging systems, X-ray imaging systems, microscope systems, mobile digital cameras, video surveillance systems, video processing systems, or other systems or devices that may need to obtain image data in one or multiple portions of the EM spectrum. Furthermore, in some embodiments, such calibration may be used generally in any devices and systems that include ADCs for digitizing analog signals.

Referring now to the drawings, FIG. 1 illustrates a block diagram of an example imaging system 100 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). The imaging system 100 may include an imaging device 105. By way of non-limiting examples, the imaging device 105 may be, may include, or may be a part of an infrared camera, a visible-light camera, a tablet computer, a laptop, a personal digital assistant (PDA), a mobile device, a desktop computer, or other electronic device. The imaging device 105 may include a housing (e.g., a camera body) that at least partially encloses components of the imaging device 105, such as to facilitate compactness and protection of the imaging device 105. For example, the solid box labeled 105 in FIG. 1 may represent a housing of the imaging device 105. The housing may contain more, fewer, and/or different components of the imaging device 105 than those depicted within the solid box in FIG. 1. In an embodiment, the imaging system 100 may include a portable device and may be incorporated, for example, into a vehicle or a non-mobile installation requiring images to be stored and/or displayed. The vehicle may be a land-based vehicle (e.g., automobile, truck), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100. In another example, the imaging system 100 may be coupled to various types of fixed locations (e.g., a home security mount, a campsite or outdoors mount, or other location) via one or more types of mounts.

The imaging device 105 includes, according to one implementation, a logic device 110, a memory component 115, an image capture component 120 (e.g., an imager, an image sensor device), an image interface 125, a control component 130, a display component 135, a sensing component 140, and/or a network interface 145. The logic device 110, according to various embodiments, includes one or more of a processor, a microprocessor, a central processing unit (CPU), a graphics processing unit (GPU), a single-core processor, a multi-core processor, a microcontroller, a programmable logic device (PLD) (e.g., field programmable gate array (FPGA)), an application specific integrated circuit (ASIC), a digital signal processing (DSP) device, or other logic device, one or more memories for storing executable instructions (e.g., software, firmware, or other instructions), and/or or any other appropriate combination of processing device and/or memory to execute instructions to perform any of the various operations described herein. The logic device 110 may be configured, by hardwiring, executing software instructions, or a combination of both, to perform various operations discussed herein for embodiments of the disclosure. The logic device 110 may be configured to interface and communicate with the various other components (e.g., 115, 120, 125, 130, 135, 140, 145, etc.) of the imaging system 100 to perform such operations. In one aspect, the logic device 110 may be configured to perform various system control operations (e.g., to control communications and operations of various components of the imaging system 100) and other image processing operations (e.g., debayering, sharpening, color correction, offset correction, bad pixel replacement, data conversion, data transformation, data compression, video analytics, etc.). In an embodiment, the logic device 110 may determine scaling factors (e.g., also referred to as calibration factors) for applying to ADCs.

The memory component 115 includes, in one embodiment, one or more memory devices configured to store data and information, including infrared image data and information. The memory component 115 may include one or more various types of memory devices including volatile and non-volatile memory devices, such as random access memory (RAM), dynamic RAM (DRAM), static RAM (SRAM), non-volatile random-access memory (NVRAM), read-only memory (ROM), programmable read-only memory (PROM), erasable programmable read-only memory (EPROM), electrically-erasable programmable read-only memory (EEPROM), flash memory, hard disk drive, and/or other types of memory. As discussed above, the logic device 110 may be configured to execute software instructions stored in the memory component 115 so as to perform method and process steps and/or operations. The logic device 110 and/or the image interface 125 may be configured to store in the memory component 115 images or digital image data captured by the image capture component 120. In some embodiments, the memory component 115 may store count values (e.g., MSB count values, LSB count values), scaling factors, and/or other data related to calibration of ADCs.

In some embodiments, a separate machine-readable medium 150 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 150 may be portable and/or located separate from the imaging device 105, with the stored software instructions and/or data provided to the imaging device 105 by coupling the machine-readable medium 150 to the imaging device 105 and/or by the imaging device 105 downloading (e.g., via a wired link and/or a wireless link) from the machine-readable medium 150. It should be appreciated that various modules may be integrated in software and/or hardware as part of the logic device 110, with code (e.g., software or configuration data) for the modules stored, for example, in the memory component 115.

The imaging device 105 may be a video and/or still camera to capture and process images and/or videos of a scene 175. In this regard, the image capture component 120 of the imaging device 105 may be configured to capture images (e.g., still and/or video images) of the scene 175 in a particular spectrum or modality. The image capture component 120 includes an image detector circuit 165 (e.g., a visible-light detector circuit, a thermal infrared detector circuit) and a readout circuit 170 (e.g., an ROIC). For example, the image capture component 120 may include an IR imaging sensor (e.g., IR imaging sensor array) configured to detect IR radiation in the near, middle, and/or far IR spectrum and provide IR images (e.g., IR image data or signal) representative of the IR radiation from the scene 175. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) SWIR radiation, mid-wave IR (MWIR) radiation (e.g., EM radiation with wavelength of 2 µm to 5 µm), and/or long-wave IR (LWIR) radiation (e.g., EM radiation with wavelength of 7 µm to 14 µm), or any desired IR wavelengths (e.g., generally in the 0.7 µm to 14 µm range). In other aspects, the image detector circuit 165 may capture radiation from one or more other wavebands of the EM spectrum, such as visible light, ultraviolet light, and so forth.

The image detector circuit 165 may capture image data (e.g., infrared image data) associated with the scene 175. To capture a detector output image, the image detector circuit 165 may detect image data of the scene 175 (e.g., in the form of EM radiation) received through an aperture 180 of the imaging device 105 and generate pixel values of the image based on the scene 175. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. The pixel value generated by the detector may be referred to as an output of the detector. By way of non-limiting examples, each detector may be a photodetector, such as an avalanche photodiode, an infrared photodetector, a quantum well infrared photodetector, a microbolometer, or other detector capable of converting EM radiation (e.g., of a certain wavelength) to a pixel value. The array of detectors may be arranged in rows and columns.

The detector output image may be, or may be considered, a data structure that includes pixels and is a representation of the image data associated with the scene 175, with each pixel having a pixel value that represents EM radiation emitted or reflected from a portion of the scene 175 and received by a detector that generates the pixel value. Based on context, a pixel may refer to a detector of the image detector circuit 165 that generates an associated pixel value or a pixel (e.g., pixel location, pixel coordinate) of the detector output image formed from the generated pixel values. In one example, the detector output image may be an infrared image (e.g., thermal infrared image). For a thermal infrared image (e.g., also referred to as a thermal image), each pixel value of the thermal infrared image may represent a temperature of a corresponding portion of the scene 175. In another example, the detector output image may be a visible-light image.

In an aspect, the pixel values generated by the image detector circuit 165 may be represented in terms of digital count values generated based on the electrical signals obtained from converting the detected radiation. For example, in a case that the image detector circuit 165 includes or is otherwise coupled to an ADC circuit, the ADC circuit may generate digital count values based on the electrical signals. In some embodiments, the ADC circuit may be a multi-ranging ADC circuit, such as a two-slope ADC circuit. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the logic device 110 that processes the detected image data as read out by the readout circuit 170, with communication of data from the readout circuit 170 to the logic device 110 facilitated by the image interface 125. An image capturing frame rate may refer to the rate (e.g., detector output images per second) at which images are detected/output in a sequence by the image detector circuit 165 and provided to the logic device 110 by the readout circuit 170. The readout circuit 170 may read out the pixel values generated by the image detector circuit 165 in accordance with an integration time (e.g., also referred to as an integration period).

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometers may absorb incident IR radiation and produce a corresponding change in temperature in the microbolometers. The change in temperature is associated with a corresponding change in resistance of the microbolometers. With each microbolometer functioning as a pixel, a two-dimensional image or picture representation of the incident IR radiation can be generated by translating the changes in resistance of each microbolometer into a time-multiplexed electrical signal. The translation may be performed by the ROIC. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the image capture component 120 may include one or more optical components and/or one or more filters. The optical component(s) may include one or more windows, lenses, mirrors, beamsplitters, beam couplers, and/or other components to direct and/or focus radiation to the image detector circuit 165. The optical component(s) may include components each formed of material and appropriately arranged according to desired transmission characteristics, such as desired transmission wavelengths and/or ray transfer matrix characteristics. The filter(s) may be adapted to pass radiation of some wavelengths but substantially block radiation of other wavelengths. For example, the image capture component 120 may be an IR imaging device that includes one or more filters adapted to pass IR radiation of some wavelengths while substantially blocking IR radiation of other wavelengths (e.g., MWIR filters, thermal IR filters, and narrow-band filters). In this example, such filters may be utilized to tailor the image capture component 120 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 120 may include an IR imaging sensor having an FPA of detectors responsive to IR radiation including near infrared (NIR), SWIR, MWIR, LWIR, and/or very-long wave IR (VLWIR) radiation. In some other embodiments, alternatively or in addition, the image capture component 120 may include a complementary metal oxide semiconductor (CMOS) sensor or a charge-coupled device (CCD) sensor that can be found in any consumer camera (e.g., visible light camera).

In some embodiments, the imaging system 100 includes a shutter 185. The shutter 185 may be operated to selectively inserted into an optical path between the scene 175 and the image capture component 120 to expose or block the aperture 180. In some cases, the shutter 185 may be moved (e.g., slid, rotated, etc.) manually (e.g., by a user of the imaging system 100) and/or via an actuator (e.g., controllable by the logic device 110 in response to user input or autonomously, such as an autonomous decision by the logic device 110 to perform a calibration of the imaging device 105). When the shutter 185 is outside of the optical path to expose the aperture 180, the electromagnetic radiation from the scene 175 may be received by the image detector circuit 165 (e.g., via one or more optical components and/or one or more filters). As such, the image detector circuit 165 captures images of the scene 175. The shutter 185 may be referred to as being in an open position or simply as being open. When the shutter 185 is inserted into the optical path to block the aperture 180, the electromagnetic radiation from the scene 175 is blocked from the image detector circuit 165. As such, the image detector circuit 165 captures images of the shutter 185. The shutter 185 may be referred to as being in a closed position or simply as being closed. In some cases, the shutter 185 may block the aperture 180 during a calibration process, in which the shutter 185 may be used as a uniform blackbody (e.g., a substantially uniform blackbody). For example, the shutter 185 may be used as a single temperature source or substantially single temperature source. In some cases, the shutter 185 may be temperature controlled to provide a temperature controlled uniform black body (e.g., to present a uniform field of radiation to the image detector circuit 165). For example, in some cases, a surface of the shutter 185 imaged by the image detector circuit 165 may be implemented by a uniform blackbody coating. In some cases, such as for an imaging device without a shutter or with a broken shutter or as an alternative to the shutter 185, a case or holster of the imaging device 105, a lens cap, a cover, a wall of a room, or other suitable object/surface may be used to provide a uniform blackbody (e.g., substantially uniform blackbody) and/or a single temperature source (e.g., substantially single temperature source).

Other imaging sensors that may be embodied in the image capture component 120 include a photonic mixer device (PMD) imaging sensor or other time of flight (ToF) imaging sensor, LIDAR imaging device, RADAR imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 120 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 125 may include, in some embodiments, appropriate input ports, connectors, switches, and/or circuitry configured to interface with external devices (e.g., a remote device 155 and/or other devices) to receive images (e.g., digital image data) generated by or otherwise stored at the external devices. In an aspect, the image interface 125 may include a serial interface and telemetry line for providing metadata associated with image data. The received images or image data may be provided to the logic device 110. In this regard, the received images or image data may be converted into signals or data suitable for processing by the logic device 110. For example, in one embodiment, the image interface 125 may be configured to receive analog video data and convert it into suitable digital data to be provided to the logic device 110.

The image interface 125 may include various standard video ports, which may be connected to a video player, a video camera, or other devices capable of generating standard video signals, and may convert the received video signals into digital video/image data suitable for processing by the logic device 110. In some embodiments, the image interface 125 may also be configured to interface with and receive images (e.g., image data) from the image capture component 120. In other embodiments, the image capture component 120 may interface directly with the logic device 110.

The control component 130 includes, in one embodiment, a user input and/or an interface device, such as a rotatable knob (e.g., potentiometer), push buttons, slide bar, keyboard, and/or other devices, that is adapted to generate a user input control signal. The logic device 110 may be configured to sense control input signals from a user via the control component 130 and respond to any sensed control input signals received therefrom. The logic device 110 may be configured to interpret such a control input signal as a value, as generally understood by one skilled in the art. In one embodiment, the control component 130 may include a control unit (e.g., a wired or wireless handheld control unit) having push buttons adapted to interface with a user and receive user input control values. In one implementation, the push buttons and/or other input mechanisms of the control unit may be used to control various functions of the imaging device 105, such as calibration initiation and/or related control, shutter control, autofocus, menu enable and selection, field of view, brightness, contrast, noise filtering, image enhancement, and/or various other features.

The display component 135 includes, in one embodiment, an image display device (e.g., a liquid crystal display (LCD)) or various other types of generally known video displays or monitors. The logic device 110 may be configured to display image data and information on the display component 135. The logic device 110 may be configured to retrieve image data and information from the memory component 115 and display any retrieved image data and information on the display component 135. The display component 135 may include display circuitry, which may be utilized by the logic device 110 to display image data and information. The display component 135 may be adapted to receive image data and information directly from the image capture component 120, logic device 110, and/or image interface 125, or the image data and information may be transferred from the memory component 115 via the logic device 110. In some aspects, the control component 130 may be implemented as part of the display component 135. For example, a touchscreen of the imaging device 105 may provide both the control component 130 (e.g., for receiving user input via taps and/or other gestures) and the display component 135 of the imaging device 105.

The sensing component 140 includes, in one embodiment, one or more sensors of various types, depending on the application or implementation requirements, as would be understood by one skilled in the art. Sensors of the sensing component 140 provide data and/or information to at least the logic device 110. In one aspect, the logic device 110 may be configured to communicate with the sensing component 140. In various implementations, the sensing component 140 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 140 may represent conventional sensors as generally known by one skilled in the art for monitoring various conditions (e.g., environmental conditions) that may have an effect (e.g., on the image appearance) on the image data provided by the image capture component 120.

In some implementations, the sensing component 140 (e.g., one or more sensors) may include devices that relay information to the logic device 110 via wired and/or wireless communication. For example, the sensing component 140 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the logic device 110 can use the information (e.g., sensing data) retrieved from the sensing component 140 to modify a configuration of the image capture component 120 (e.g., adjusting a light sensitivity level, adjusting a direction or angle of the image capture component 120, adjusting an aperture, etc.). The sensing component 140 may include a temperature sensing component to provide temperature data (e.g., one or more measured temperature values) various components of the imaging device 105, such as the image detection circuit 165 and/or the shutter 185. By way of non-limiting examples, a temperature sensor may include a thermistor, thermocouple, thermopile, pyrometer, and/or other appropriate sensor for providing temperature data.

In some embodiments, various components of the imaging system 100 may be distributed and in communication with one another over a network 160. In this regard, the imaging device 105 may include a network interface 145 configured to facilitate wired and/or wireless communication among various components of the imaging system 100 over the network 160. In such embodiments, components may also be replicated if desired for particular applications of the imaging system 100. That is, components configured for same or similar operations may be distributed over a network. Further, all or part of any one of the various components may be implemented using appropriate components of the remote device 155 (e.g., a conventional digital video recorder (DVR), a computer configured for image processing, and/or other device) in communication with various components of the imaging system 100 via the network interface 145 over the network 160, if desired. Thus, for example, all or part of the logic device 110, all or part of the memory component 115, and/or all of part of the display component 135 may be implemented or replicated at the remote device 155. In some embodiments, the imaging system 100 may not include imaging sensors (e.g., image capture component 120), but instead receive images or image data from imaging sensors located separately and remotely from the logic device 110 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the logic device 110 may be combined with the memory component 115, image capture component 120, image interface 125, display component 135, sensing component 140, and/or network interface 145. In another example, the logic device 110 may be combined with the image capture component 120, such that certain functions of the logic device 110 are performed by circuitry (e.g., a processor, a microprocessor, a logic device, a microcontroller, etc.) within the image capture component 120.

Figure 2:
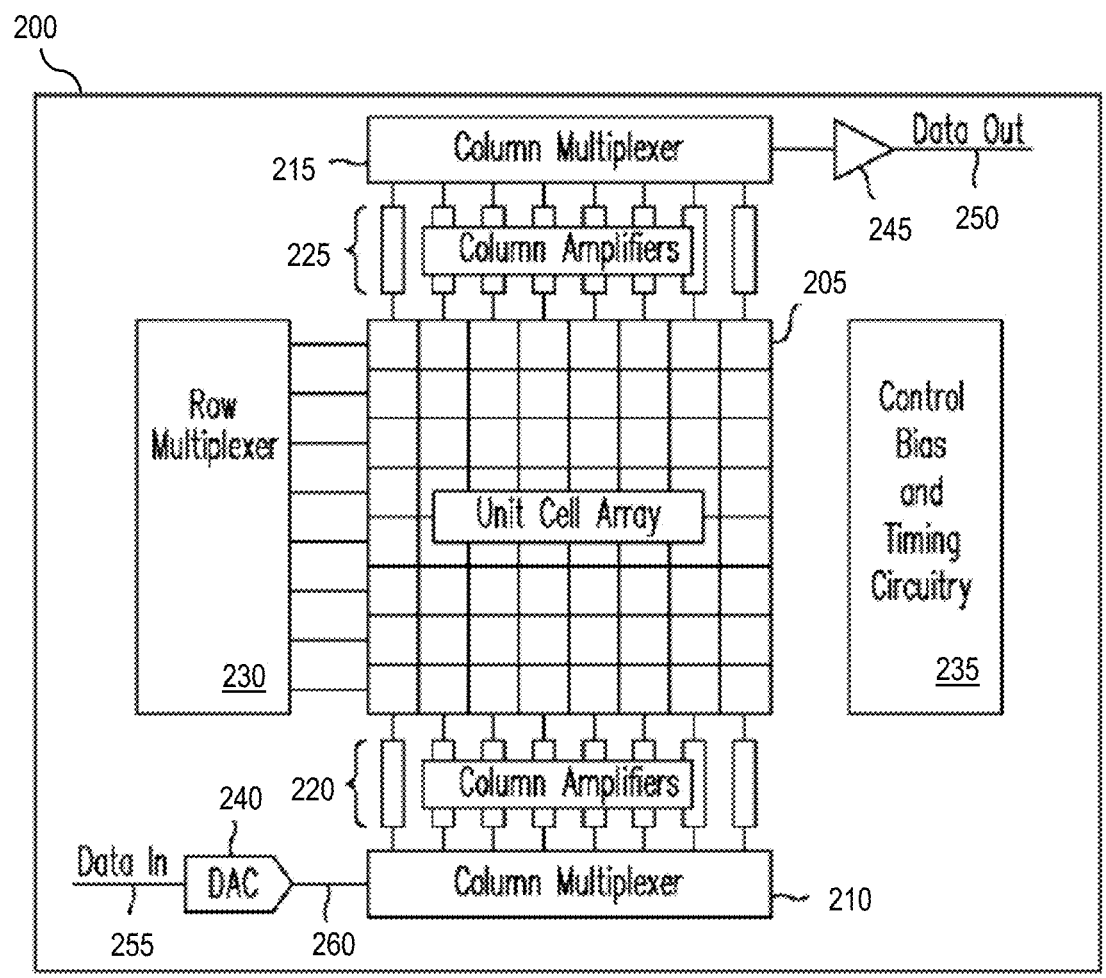
FIG. 2 illustrates a block diagram of an example image sensor assembly in accordance with one or more embodiments of the present disclosure.

FIG. 2 illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the image capture component 120 of FIG. 1.

The image sensor assembly 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. In some aspects, operations of and/or pertaining to the unit cell array 205 and other components may be performed according to a system clock and/or synchronization signals (e.g., line synchronization (LSYNC) signals). The unit cell array 205 includes an array of unit cells. In an aspect, each unit cell may include a detector (e.g., a pixel) and interface circuitry. The interface circuitry of each unit cell may provide an output signal, such as an output voltage or an output current, in response to a detection signal (e.g., detection current, detection voltage) provided by the detector of the unit cell. The output signal may be indicative of the magnitude of EM radiation received by the detector and may be referred to as image pixel data or simply image data. The column multiplexer 215, column amplifiers 220, row multiplexer 230, and data output buffer 245 may be used to provide the output signals from the unit cell array 205 as a data output signal on a data output line 250. The output signals on the data output line 250 may be provided to components downstream of the image sensor assembly 200, such as processing circuitry (e.g., the logic device 110 of FIG. 1), memory (e.g., the memory component 115 of FIG. 1), display device (e.g., the display component 135 of FIG. 1), and/or other component to facilitate processing, storage, and/or display of the output signals. The data output signal may be an image formed of the pixel values for the image sensor assembly 200. In this regard, the column multiplexer 215, the column amplifiers 220, the row multiplexer 230, and the data output buffer 245 may collectively provide an ROIC (or portion thereof) of the image sensor assembly 200. In an aspect, the interface circuitry may be considered part of the ROIC, or may be considered an interface between the detectors and the ROIC. In some embodiments, components of the image sensor assembly 200 may be implemented such that the unit cell array 205 and the ROIC may be part of a single die.

The column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals (e.g., to obtain digital count values). These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., visible-light, IR light) incident on the detectors of the unit cells. In an aspect, the control bias and timing circuitry 235 may be, may include, or may be a part of, a logic circuit.

The control bias and timing circuitry 235 may generate control signals for addressing the unit cell array 205 to allow access to and readout of image data from an addressed portion of the unit cell array 205. The unit cell array 205 may be addressed to access and readout image data from the unit cell array 205 row by row, although in other implementations the unit cell array 205 may be addressed column by column or via other manners.

The control bias and timing circuitry 235 may generate bias values and timing control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. For example, the DAC 240 may drive digital control signals (e.g., provided as bits) to appropriate analog signal levels for the unit cells. In some technologies, a digital control signal of 0 or 1 may be driven to an appropriate logic low voltage level or an appropriate logic high voltage level, respectively. In another aspect, the control bias and timing circuitry 235 may generate the bias signals (e.g., analog signals) and provide the bias signals to the unit cells without utilizing the DAC 240. In this regard, some implementations do not include the DAC 240, data input signal line 255, and/or analog signal line(s) 260. In an embodiment, the control bias and timing circuitry 235 may be, may include, may be a part of, or may otherwise be coupled to the logic device 110 and/or image capture component 120 of FIG. 1.

In an embodiment, the image sensor assembly 200 may be implemented as part of an imaging device (e.g., the imaging device 105). In addition to the various components of the image sensor assembly 200, the imaging device may also include one or more processors, memories, logic, displays, interfaces, optics (e.g., lenses, mirrors, beamsplitters), and/ or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as non-uniformity correction (e.g., flat-field correction or other calibration technique), spatial and/or temporal filtering, and/or other operations. The images (e.g., processed images) may be stored in memory (e.g., external to or local to the imaging system) and/or displayed on a display device (e.g., external to and/or integrated with the imaging system). The various components of FIG. 2 may be implemented on a single chip or multiple chips. Furthermore, while the various components are illustrated as a set of individual blocks, various of the blocks may be merged together or various blocks shown in FIG. 2 may be separated into separate blocks.

It is noted that in FIG. 2 the unit cell array 205 is depicted as an 8×8 (e.g., 8 rows and 8 columns of unit cells. However, the unit cell array 205 may be of other array sizes. By way of non-limiting examples, the unit cell array 205 may include 512×512 (e.g., 512 rows and 512 columns of unit cells), 1024×1024, 2048×2048, 4096×4096, 8192×8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

Figure 3:
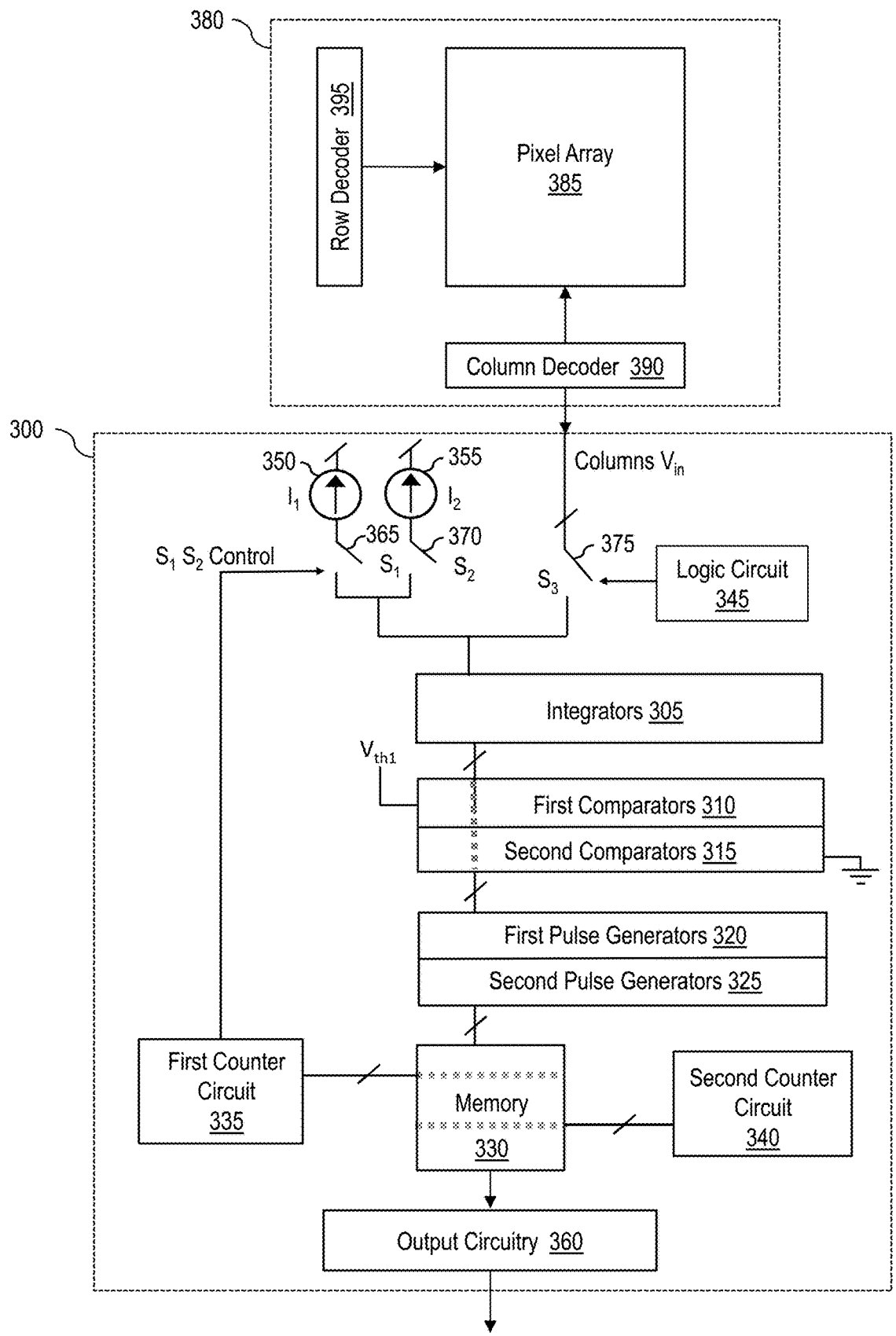
FIG. 3 illustrates a block diagram of an example analog-to-digital converter and associated image sensor circuitry in accordance with one or more embodiments of the present disclosure.

FIG. 3 illustrates a block diagram of an example ADC 300 and associated image sensor circuitry 380 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The image sensor circuitry 380 includes a pixel array 385, a column decoder 390, and a row decoder 395. The pixel array 385 includes an array of detectors (e.g., photodetectors, microbolometers), with each detector detecting EM radiation and generating a pixel value based on the detected EM radiation. The pixel value of a detector may be, or may be indicative of, a detector signal (e.g., detector voltage, detector current) generated by the detector in response to the EM radiation. Pixel array data is multiplexed out using the column decoder 390 and the row decoder 395. In this regard, the column decoder 390 and the row decoder 395 may perform appropriate column addressing operations and row addressing operations to facilitate read out of analog detector signals generated by the detectors of the pixel array 385. The analog detector signals may then be provided to the ADC 300 for conversion. As an example, FIG. 3 illustrates a column parallel output architecture, in which data from each column is read out in parallel one row at a time. In this architecture, data may be sampled and held at the column level for conversion by the ADC 300. In an embodiment, the pixel array 385 may be, may include, or may be a part of, the unit cell array 205 of FIG. 2.

The ADC 300 includes integrators 305, first comparators 310, second comparators 315, first pulse generators 320, second pulse generators 325, memory 330, a first counter circuit 335, a second counter circuit 340, a logic circuit 345, a first reference generator 350, a second reference generator 355, and output circuitry 360. Each of the integrators 305 generates an integrator output signal based on an input signal provided to the integrator. In FIG. 3, each of the integrators 305 selectively receives a respective detector signal yin (e.g., generated by a respective detector of the pixel array 385), selectively receives a reference current signal $I_1$ from the first reference generator 350, or selectively receives a reference current signal $I_2$ from the second reference generator 355. Signals are provided selectively to the integrators 305 via switching implemented using switches 365, 370, and 375, denoted as $S_1$, $S_2$, and $S_3$, respectively, and may be referred to as first reference signal switches, second reference signal switches, and detector signal switches. As an example, $I_2$ may be equal to $I_1/255$.

Each of the integrators 305 may receive a detector signal from a detector of a column of the pixel array 385 when a corresponding detector switch 375 closes. The logic circuit 345 may be operated to control $S_3$ to selectively couple the detector signal to the integrators 305. For a given integrator, at a time that $S_3$ closes, the integrator begins to integrate the detector signal and charge a capacitor of the integrator. The integrator may integrate the detector signal until a time when $S_3$ opens and $S_1$ closes.

At a time that $S_1$ closes, the integrator receives the first reference signal $I_1$, which causes the capacitor of the integrator to discharge. While the capacitor discharges, the integrator generates an integrator output signal that changes (e.g., increases, decreases) with time. The integrator continues to generate a changing output in response to receiving the first reference signal $I_1$ until a time when $S_1$ opens and $S_2$ closes. In some cases, the time when $S_1$ opens and $S_2$ closes may be when the integrator output signal reaches a reference signal/level Vim (e.g., also referred to as a threshold signal/level). At a time that $S_2$ closes, the integrator receives the second reference signal $I_2$, which causes the integrator to continue discharging and further generate a changing output signal until the integrator output signal reaches a reference signal/level $V_{th2}$ (e.g., also referred to as a threshold signal/level). As an example, in FIG. 3, $V_{th2}$ may be ground level (e.g., 0 V). In some cases, the integrator output signal may ramp up (e.g., nominally monotonically increase with time) while the detector signal is provided to the integrator, ramp down (e.g., nominally monotonically decrease with time) while the capacitor discharges when the integrator receives $I_1$, and/or ramp down (e.g., nominally monotonically decrease with time) while the capacitor discharges when the integrator receives $I_2$. In some cases, the integrator output signal may ramp down while the detector signal is provided to the integrator, ramp up while the capacitor discharges when the integrator receives $I_1$, and/or ramp up while the capacitor discharges when the integrator receives $I_2$.

The first comparators 310 compare integrator output signals (e.g., voltages) from the integrators 305 with the threshold signal $V_{th1}$ and generates comparator output signals based on the comparisons. The threshold signal $V_{th1}$ may be generated by a reference generator. In some cases, the threshold signal $V_{th1}$ may be based on a threshold voltage associated with the first comparators 310 and the second comparators 315. For example, $V_{th1}$ may be approximately between 0.5 V to 0.7 V.

For a given comparator of the first comparators 310, the comparator receives an output signal from an integrator (e.g., a corresponding integrator of the integrators 305) at a first input terminal of the comparator and the threshold signal $V_{th1}$ at a second input terminal of the comparator and generates a comparator output signal based on a comparison of the signals. In an aspect, the comparator may generate a comparator output signal at or otherwise associated with a first state/level when the integrator signal exceeds $V_{th1}$ and generate a comparator output signal at or otherwise associated with a second state/level different from the first state when the integrator signal does not exceed $V_{th1}$. The first state may be a logic low (e.g., logic 0) and the second state may be a logic high (e.g., logic 1), or vice versa. As an example, when the first state is a logic low and the second state is a logic high, the comparator output transitions from high when the integrator signal exceeds $V_{th1}$ to low when the integrator signal does not exceed $V_{th1}$.

The second comparators 315 compare integrator output signals (e.g., voltages) from the integrators 305 with the threshold signal $V_{th2}$ and generates comparator output signals based on the comparisons. For example, the threshold voltage $V_{th2}$ may be a ground reference level (e.g., 0 V), in which, for a given second comparator, a first input terminal of the second comparator may be coupled to the integrator output signal and a second input terminal of the second comparator may be tied to ground. In this regard, the second comparator may receive an output signal from an integrator (i.e., the corresponding integrator of the integrators 305 described above with respect to the first comparators 310), compare the integrator output signal in relation to the threshold signal $V_{th2}$, and generate a comparator output signal based on the comparison. In an aspect, the comparator may generate a comparator output signal at or otherwise associated with a first state/level when the integrator signal is at a higher level (e.g., voltage potential) than the threshold signal $V_{th2}$, and generate a comparator output signal at or otherwise associated with a second state/level different from the first level when the integrator signal does not exceed (e.g., reaches) the threshold signal $V_{th2}$. The first state may be a logic low (e.g., logic 0) and the second state may be a logic high (e.g., logic 1), or vice versa. As an example, when the first state is a logic low and the second state is a logic high, the comparator output transitions from high when the integrator signal exceeds the threshold signal $V_{th2}$ to low when the integrator signal the threshold signal $V_{th2}$ (e.g., reaches ground voltage).

The first pulse generators 320 receive comparator output signals from the first comparators 310. In an aspect, for a given pulse generator of the first pulse generators 320, the pulse generator may generate a pulse in response to a transition of a comparator output signal received by the pulse generator from the first state (e.g., logic low) to the second state (e.g., logic high). In this regard, an output transition from one of the first comparators 310 may cause a corresponding one of the first pulse generators 320 to transmit a pulse signal to a respective memory element of the memory 330. In some cases, the pulse signal may be between 1 ns and 2 ns in duration. In an aspect, the pulse signal duration may be set to be less than a duration associated with a period of the first counter circuit 335.

The second pulse generators 325 receive comparator output signals from the second comparators 315. In an aspect, for a given pulse generator of the second pulse generators 325, the pulse generator may generate a pulse in response to a transition of a comparator output signal received by the pulse generator from the first state (e.g., logic low) to the second state (e.g., logic high). In this regard, an output transition from one of the second comparators 315 may cause a corresponding one of the second pulse generators 325 to transmit a pulse signal to a respective memory element of the memory 330. In some cases, the pulse signal may be between 1 ns and 2 ns in duration. In an aspect, the pulse signal duration may be set to be less than a duration associated with a period of the second counter circuit 340. In some cases, the period of the first counter circuit 335 may be different from the period of the second counter circuit 340.

Memory elements of the memory 330 receive a first pulse signal from their respective first pulse generators 320 and a second pulse signal from their respective second pulse generators 325. In some cases, the memory 330 may be static memory (e.g., the memory elements may be static memory elements). The memory elements of the memory 330 may include, for example, a latch or flip-flop circuit to store data (e.g., a digital count value). In an aspect, the memory elements may include inverter devices or circuitry that are not actively driven by the counter circuits 335 and 340. The memory elements may include crossed-coupled inverters.

The first counter circuit 335 adjusts a first digital count value as a function of time. The first digital count value may be incremented according to a first system clock, such as may be provided by the control bias and timing circuitry 235 of FIG. 2. In an embodiment, the counter circuit 335 provides control bits to operate (e.g., selective close or open) switches $S_1$ and $S_2$. When $S_1$ is closed, the first counter circuit 335 may synchronously adjust the first digital count value in tandem with adjustment of the integrator output signal by the integrators 305 based on the reference signal $I_1$.

The second counter circuit 340 adjusts a second digital count value as a function of time. The second digital count value may be incremented according to a second system clock, such as may be provided by the control bias and timing circuitry 235 of FIG. 2. In an aspect, the second clock utilized by the second counter circuit 340 may be faster than the first clock utilized by the first counter circuit 335. In some cases, the first clock utilized by the first counter circuit 335 may be referred to as a synchronous clock. When $S_2$ is closed, the second counter circuit 340 may synchronously adjust the second digital count value in tandem with adjustment of the integrator output signal by the integrators 305 based on the reference signal $I_2$.

In response to the first pulse signal, a first memory element may capture a first digital count value from the first counter circuit 335. In response to the second pulse signal, a second memory element captures a second digital count value from the second counter circuit 340. For a given detector signal $V_{in}$, the first digital count value and the second digital count value may be combined to obtain a total digital count value (e.g., also referred to as an ADC conversion value) that is indicative of the detector signal $V_{in}$. In this regard, the first digital count value and the second digital count value collectively provide a digital representation of the detector signal yin. The first digital count value may provide a first set of bits of the total digital count value and the second digital count value may provide a second set of bits of the total digital count value. In an aspect, the first set of bits may be most significant bits (MSBs) of the total digital count value and the second set of bits may be least significant bits (LSBs) of the total digital count value. In some cases, the first digital count value may contribute a coarse conversion of the detector signal yin and the second digital count value may contribute a fine component associated with the detector signal yin. As such, in an embodiment, a first digital count value stored in the memory 330 and its corresponding second digital count value stored in the memory 330, when combined, provides a digital representation (e.g., ADC conversion value) of a respective detector signal generated by a respective detector of the pixel array 385.

An output circuitry 360 may be coupled to the memory 330 and may be configured to further process digital data, such as the digital count values, stored in the memory 330. In some aspects, the output circuitry 360 may determine scaling factors (e.g., as part of calibration processes) based on count values stored in the memory 330. In some cases, such processing may include generating a data structure containing the digital count values for processing, storage, and/or display by components downstream of the output circuitry 360 (e.g., logic devices, memories, display devices, etc.). In one case, the output circuitry 360 may be considered or implemented as part of the ROIC. In an embodiment, the output circuitry 360 may be implemented by a logic device (e.g., the logic device 110). The output circuitry 360 may be implemented as part of the ADC 300, as shown in FIG. 3, or separate from the ADC 300.

It is noted that in some embodiments the first pulse generators 320 and the second pulse generators 325 are optional. In some cases, the comparators 310 and 315 are directly providing comparator output signals to the memory 330 without intervening pulse generators such that the memory elements of the memory 330 may store each counter value received from a counter circuit and thus consume power each time the counter circuit adjusts its counter value. For example, a memory element may store each counter value received from a counter circuit while the comparator output signal applied to the memory element remains at logic high. For some implementations, utilization of pulse generators may allow reduced power consumption relative to a case in which comparators are directly connected to memory (e.g., without intervening pulse generators). In this regard, with the pulse generators, power consumption of memory elements may primarily be associated with the moment of capturing (e.g., storing, latching) a counter value (e.g., for the duration of the pulse signal utilized to capture the counter value) generated by a counter circuit. At other times, the memory element does not capture the counter value generated by the counter circuit. In some cases, the pulse generators may act as output buffers to drive the memory elements. In acting as output buffers, the pulse generators may facilitate faster transitions, which may enable higher speed ADC designs.

Figure 4:
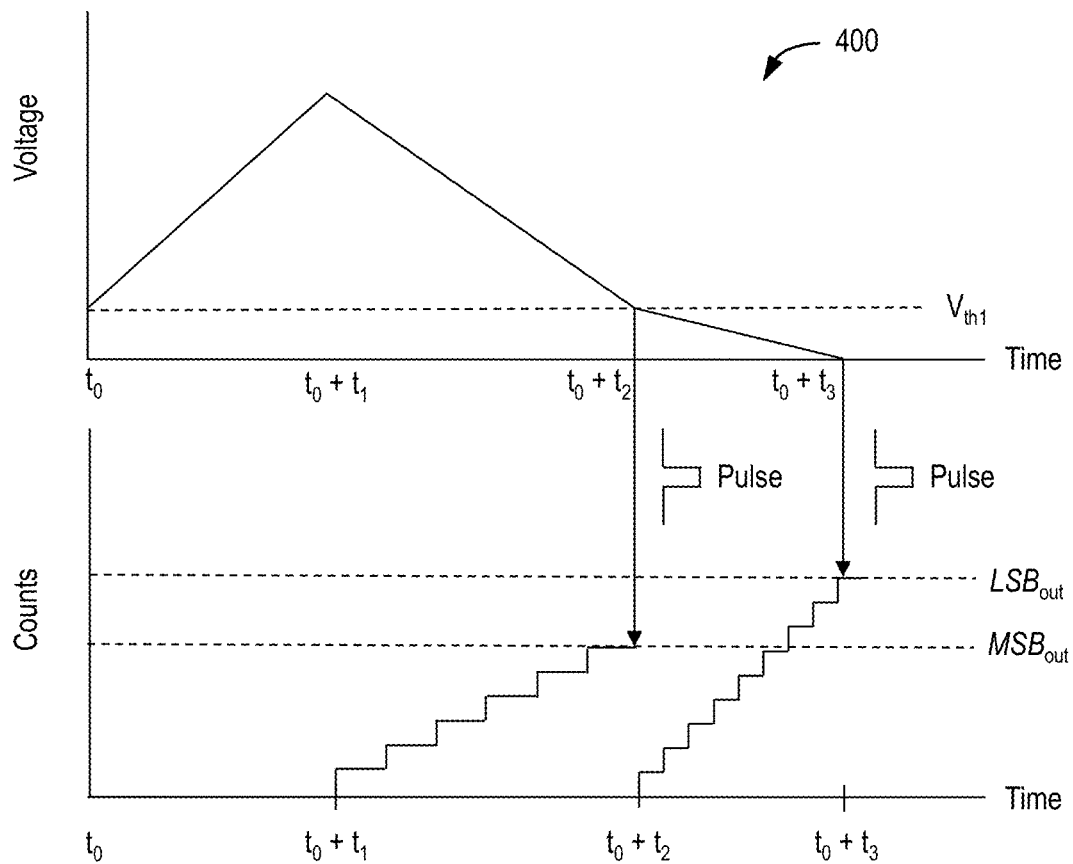
FIGS. 4 and 5 each illustrate a graph associated with operation of an analog-to-digital converter in accordance with one or more embodiments of the present disclosure.

FIG. 4 illustrates a graph 400 associated with operation of the ADC 300 in accordance with one or more embodiments of the present disclosure. Initially, to facilitate conversion of detector signals from the pixel array 385, each of the integrators 305, the first counter circuit 335, and the second counter circuit 340 may be reset at a time $t=t_0$. For example, the reset may be performed such that the first counter circuit 335 and the second counter circuit 340 are at a zero digital count value and the integrator output is at a threshold voltage (e.g., the reference signal $V_{in}$). At $t=t_0$, $S_1$ and $S_2$ may be open and $S_3$ may be closed. For a given integrator (e.g., one of the integrators 305), at the moment that $S_3$ is closed, the integrator begins to generate an integrator output signal. In an embodiment, the integrator output signal may be a positive voltage ramp beginning from $V_{th1}$. In an aspect, a slope of the voltage ramp is proportional to the detector signal $V_{in}$ provided as an input to the integrator when $S_3$ is closed.

At time $t=t_0+t_1$ (e.g., after a duration $t_1$ has passed since beginning to ramp up the integrator output voltage and the first digital count value), $S_3$ opens and $S_1$ closes to allow providing of the first reference signal $I_1$ to an input of the integrators. In an aspect, $t_1$ may be a predetermined amount of time. In some cases, $t_1$ may be set by a user. In an aspect, a time from $t_0$ to $t_0+t_1$ may be referred to as an input integration or an input sampling. At time $t=t_0+t_1$, the first counter circuit 335 begins adjusting the first digital count value in tandem with adjustment of a downward ramp voltage for the integrators output signal as capacitors of the integrators discharge.

At time $t=t_0+t_2$, the integrator output signal reaches (e.g., meets, crosses, equals) a threshold voltage Vim. At this time, in response to comparing the integrator output signal with the threshold voltage Vim and determining that the integrator output signal reached the threshold voltage $V_{th1}$, a comparator of the first comparators 310 generates a comparator output signal that transitions (e.g., from high to low or low to high depending on implementation). A respective one of the first pulse generators 320 determines a rising or falling edge of the comparator output transition and, in response, generates a first pulse signal. The first pulse signal may be received at a memory element of the memory 330, and, in response to receiving the first pulse signal, the memory element may capture the first digital count value (denoted as $MSB_{out}$) from the first counter circuit 335. In an aspect, a time from $t_0+t_1$ to $t_0+t_2$ may be referred to as a coarse integration, a first integration, a first stage, or variation thereof (e.g., a first integration stage).

Additionally, at time $t=t_0+t_2$, $S_1$ opens and $S_2$ closes to allow providing of the second reference signal $I_2$ to an input of the integrators. At time $t=t_0+t_2$, the second counter circuit 340 begins adjusting the second digital count value in tandem with the adjustment of a downward ramp voltage for the integrator output signals as capacitors of the integrators continue to discharge. In an aspect, the discharge rate of the integrators when $S_2$ is closed is lower than when $S_1$ was closed (e.g., due to a difference between $I_1$ and $I_2$). As an example, $I_2$ may be $I_1/255$.

At time $t=t_0+t_3$, the integrator output signal reaches (e.g., meets, crosses, equals) a ground voltage. At this time, in response to comparing the integrator output signal with the ground voltage and determining that the integrator output signal reached the ground voltage, a comparator of the second comparators 315 generates a comparator output signal that transitions (e.g., from high to low or low to high dependent on implementation). A respective one of the second pulse generators 315 determines a rising or falling edge of the comparator output transition and, in response, generates a second pulse signal. The second pulse signal may be received at a memory element of the memory 330, and, in response to receiving the second pulse signal, the memory element may capture a second digital count value (denoted as $LSB_{out}$) from the second counter circuit 340. In an aspect, a time from $t_0+t_2$ to $t_0+t_3$ may be referred to as a fine integration, a second integration, a second stage, or variation thereof (e.g., a second integration stage). In an embodiment, the first and second digital count values stored in the memory 330 collectively provide digital representations (e.g., ADC conversion values) of the detector signals generated by the detectors of the pixel array 385. In this regard, a first digital count value and its corresponding second digital count value may be combined to obtain a total digital count value. In an aspect, the total digital value is a digital representation of the detector signal yin utilized to obtain the first and the second digital count values.

Figure 5:
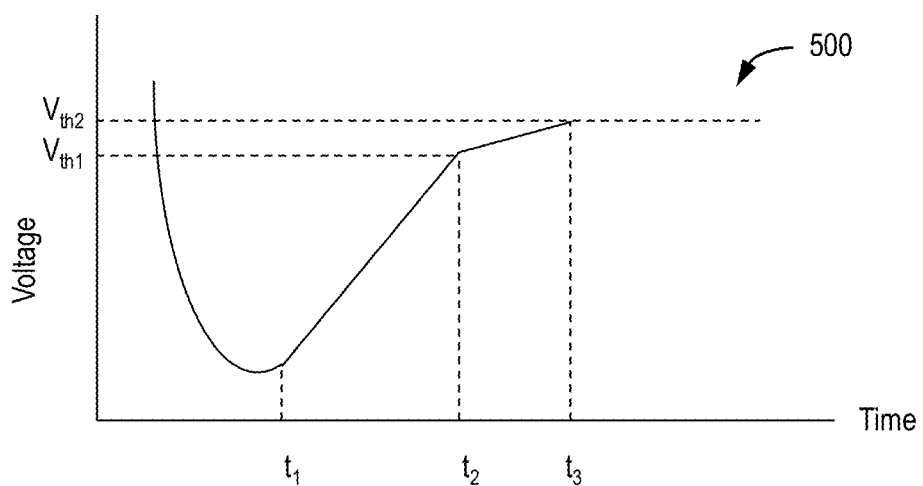

Although the graph 400 of FIG. 4 provides an example with downward ramps, other ADC architectures may be associated with upward ramps. FIG. 5 illustrates a graph 500 associated with operation of an ADC in accordance with one or more embodiments of the present disclosure. The ADC may have components arranged the same as or similar to the ADC 300. For $t<t_1$, $S_1$ and $S_2$ may be open and $S_3$ may be closed such that an integrator (e.g., 305) generates an integrator output signal as an input signal to be digitized is provided to the integrator. At $t=t_1$, the integrator switches from receiving the input signal to receiving a reference signal $I_1$ (e.g., a current signal). From $t=t_1$ to $t=t_2$, the integrator generates an integrator output signal that ramps up and a first counter circuit increments its counter value. This ramp may be referred to as a first ramp. A comparator receives the integrator output signal and a reference signal $V_{th1}$ and generates a comparator output signal in a first state (e.g., a logic low). At $t=t_2$, the integrator output signal reaches the reference signal $V_{th1}$ and trips the comparator (e.g., the comparator output signal transitions from the first state to a second state). The counter value at $t=t_2$ is may correspond to a first set of bits (e.g., MSBs). At $t=t_2^+$, the integrator switches from receiving the reference signal $I_1$ to receiving a reference signal $I_2$ (e.g., a current signal). From $t=t_2^+$ to $t=t_3$, the integrator generates an integrator output signal that ramps up and a second counter circuit increments its counter value. This ramp may be referred to as a second ramp. The comparator receives the integrator output signal and a reference signal $V_{th2}$ (e.g., ground level) and generates a comparator output signal in a first state. At $t=t_3$, the integrator output signal reaches the reference signal $V_{th2}$ and trips the comparator (e.g., the comparator output signal transitions from the first state to a second state). The counter value at $t=t_3$ may correspond to a second set of bits (e.g., LSBs). In some cases, $I_2=I_1/255$.

Although the graphs 400 and 500 show implementations in which an end of a first conversion stage coincides with a start of a next conversion stage, in other cases a time may be allocated for the first conversion stage and the second conversion stage. In some cases, the time for the first conversion stage may be longer than the time for the second conversion stage. For a given conversion stage, conversion associated with input signals from columns of a pixel array may be performed in parallel and the time may be allocated for the conversion stage to allow comparators to trip for all columns for a range of values of input signals accommodated for by the ADC. For example, an input voltage level for a first column may be lower and thus associated with a shorter conversion time whereas an input voltage level for a second column may be higher and thus associated with a longer conversion time. A count value for the first column may be stored/latched early in the time allocated for the first ramp whereas a count value for the second column may be stored/latched later in the time allocated for the first ramp.

Figure 6:
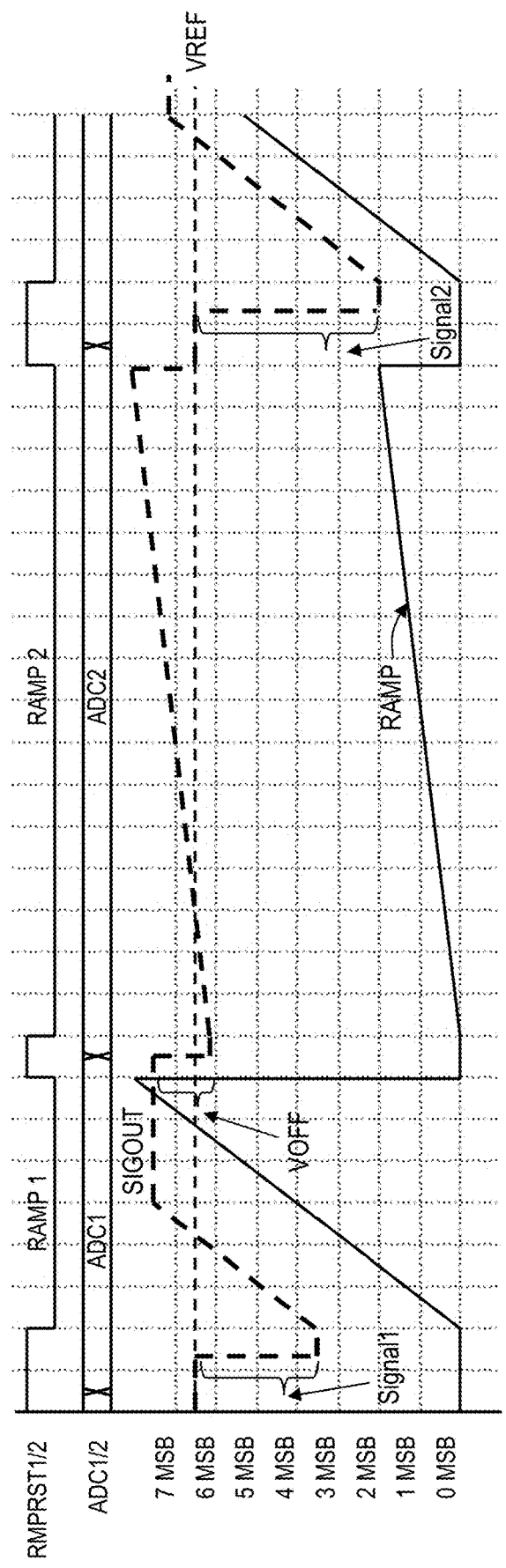
FIG. 6 illustrates signal waveforms associated with operation of an analog-to-digital converter in accordance with one or more embodiments of the present disclosure.

FIG. 6 illustrates signal waveforms associated with operation of an ADC in accordance with one or more embodiments of the present disclosure. An input signal (denoted as $Signal_1$) to the ADC is captured and then a ramp applied to the input signal to move the input signal in relation to a fixed reference voltage $V_{REF}$. A resulting signal from applying the ramp to the input signal is denoted as $SIG_{OUT}$ in FIG. 6. The ADC may have the same or similar architecture as the ADC 300 of FIG. 3 (e.g., with or without pulse generators) and/or other two-slope ADC architectures.

An amount of time taken for the signal with the ramp applied to cross the reference level, and thus trip (e.g., also referred to as fire) a comparator (e.g., cause a comparator output signal to transition from one state to another), is a measure of MSBs associated with the input signal. Once the comparator trips, the ramping of the input signal continues to increase until a start of a next clock cycle (e.g., a next synchronous clock cycle). Stopping of the ramp on the input signal synchronous with a clock allows saved levels to correspond to count values associated with the MSBs. In some cases, conversion of input signals from the columns may be performed in parallel and a respective time may be allocated for each of the first ramp and the second ramp to allow comparators to trip for all columns for a range of values for the input signal accommodated for by the ADC. In an aspect, count values associated with the MSBs may be referred to as MSB count values. In general for multi-ranging ADCs, this first ramp (e.g., corresponding to and/or referred to as a first conversion stage or a first stage) is generally associated with more time than a second ramp and, if any, subsequent ramps. Thus, the clock used to synchronize the end of the first ramp and thus associated with the MSB count values is generally not the fastest clock of a system.

After an MSB count value has been saved and the first ramp stopped, a second ramp may be applied. The second ramp may have a lower scope (e.g., scaled in integer increments based on a number of bits for the LSB and the time dedicated for the first ramp compared to a time dedicated for the second ramp) and may sweep over a finer range to be able to digitize the LSB count value to within a small voltage level. As the input signal crosses a reference signal during the second ramp, a comparator may trip and store (e.g., latch) a counter value at that time that is indicative of the LSBs. In an aspect, count values associated with the LSBs may be referred to as LSB count values. Such a clock is generally faster than the clock associated with the first ramp to allow finer counter values associated with the LSBs to be stored. Since such a clock is asynchronous with the clock for the first ramp, the LSB counter value may be referred to as being asynchronously stored/latched. As an example, a full scale range associated with the coarse conversion may be around 2 V and a full scale range associated with the fine conversion may be around 125 mV. After the input signal $Signal_1$ is converted, the ADC may then capture a next input signal, denoted as $Signal_2$.

Dependent on ADC architecture/implementation, the second ramp may be implemented in multiple ways. As one example, the second ramp may continue in the same direction as the first ramp (e.g., as shown in FIGS. 4 and 5), with the reference level shifted up. As another example, the second ramp could ramp in the opposite direction, as it will initially overshoot a target reference level, potentially with some offset applied to ensure it will cross the reference level again. Before the second ramp starts, an offset may be applied to shift the input signal to the opposite side of the reference level before the ramp continues in the same direction again. Other examples of ADCs and associated waveforms are set forth in U.S. patent application Ser. No. 17/362,876 filed Jun. 29, 2021, which is incorporated herein by reference in its entirety.

In some embodiments, multi-ranging ADCs may facilitate fast conversion of analog input signals. Figures of merit for an ADC may include monotonicity and DNL with not missing or redundant codes. Appropriate calibration may be performed to allow the multiple ranges to be combined with an accuracy such that a final/combined ADC output is monotonic and does not have any missing codes. A monotonic code with no missing codes may have a DNL between −1 and +1.

Although embodiments herein are generally described with respect to ADC architectures having a first ramp associated with a first set of bits (e.g., MSBs) of a digital representation of an analog signal (e.g., a detector signal)

and a second ramp associated with a second set of bits (e.g., LSBs) of the digital representation, such ADC architectures may generate a digital representation of an analog signal using more than two ramps, with each ramp being associated with a respective set of bits of the digital representation.

In a two-ramp ADC (e.g., also referred to as a two-slope ADC), a first ramp may be swept through a signal range to determine a first set of bits (e.g., MSBs) of a digital representation of an analog signal and then a second ramp may be swept to determine a second set of bits (e.g., LSBs) of the digital representation. In some cases, the first ramp is a steeper/faster ramp than the second ramp. It is noted that each of the first and second ramps may be a linear ramp or a non-linear ramp. If a slope of these two ramps are not matched (e.g., the first ramp and/or the second ramp are not at their respective predetermined values), non-monotonicity (or equivalently, missing codes) may occur.

In some embodiments, calibration may be performed on the two-ramp ADC to determine a scaling factor (e.g., also referred to as a calibration factor) for applying to a count value (e.g., corresponding to MSBs) to correct for mismatch (e.g., gain mismatch) between the first ramp and the second ramp. Correcting for such mismatch may allow avoiding of redundant or missing codes. The calibration may be based on a relationship between a start of the first ramp and a start of a first counter. The start of the first ramp may be a time at which the first ramp starts to ramp up or ramp down. The start of the first counter may be a time at which the first counter starts to increment or decrement.

Figure 7A:
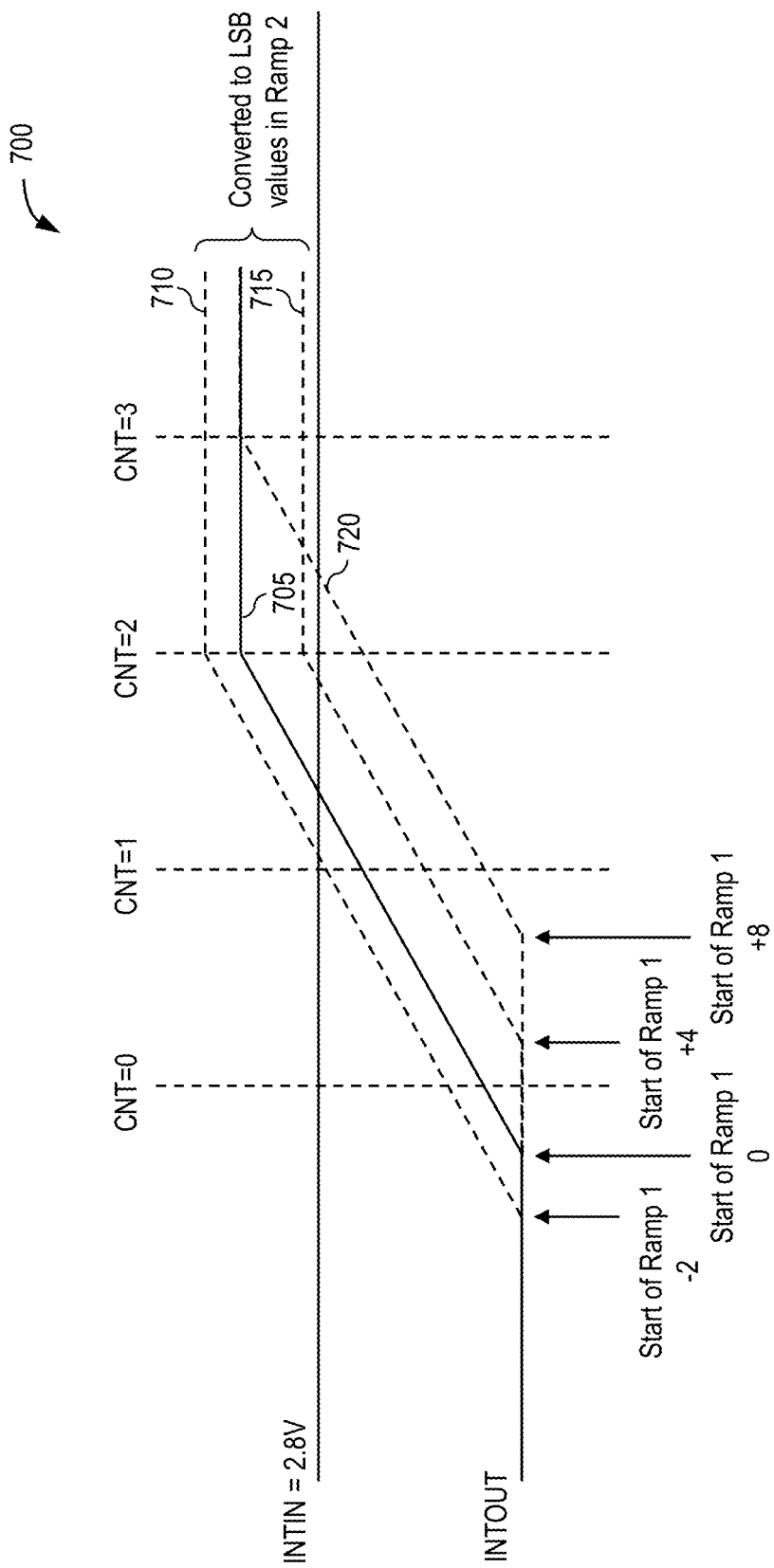
FIG. 7A illustrates a graph with a first ramp started at different times relative to a counter for facilitating analog-to-digital converter calibration in accordance with one or more embodiments of the present disclosure.

FIG. 7A illustrates a graph 700 with a first ramp started at different times relative to a counter for facilitating ADC calibration in accordance with one or more embodiments of the present disclosure. The first ramp may be associated with an MSB count (e.g., also referred to as a coarse count) generated by an MSB counter circuit. In an aspect, a start of the MSB counter circuit, a start of the MSB counter signal, or a start of the MSB counter may be used interchangeably to refer to a time at which the MSB counter circuit starts to increment its count value according to a first clock. A second ramp (not shown) may be used after the first ramp to obtain an LSB count (e.g., also referred to as a fine count). As an example, the first ramp may be the ramp from $t_1$ to $t_2$ in the graph 500 of FIG. 5 and the second ramp may be the ramp from $t_2$ to $t_3$ in the graph 500 of FIG. 5.

A signal $INT_{OUT}$ (e.g., a voltage signal) may be, or may represent/simulate, an integrator output voltage. An initial value of the signal $INT_{OUT}$ may be obtained from integration associated with an input signal to the ADC (e.g., integration during $t < t_1$ in the graph 500 of FIG. 5). In some cases, the input signal to the ADC may be, or may represent/simulate, a detector signal from a detector of a pixel array (e.g., the pixel array 385). As an example, the initial value may be the value at time $t_1$ in the graph 500 of FIG. 5. The signal $INT_{OUT}$ may ramp up from the initial value. A comparator (e.g., one of the first comparators 310) may receive the signal $INT_{OUT}$ and a reference signal $INT_{IN}$ and generate a comparator output signal based on the signal $INT_{OUT}$ and the reference signal $INT_{IN}$. The comparator output signal may be in a first state (e.g., logic low) when the signal $INT_{OUT}$ does not exceed the reference signal $INT_{IN}$ and in a second state (e.g., logic high) when the signal $INT_{OUT}$ exceeds the reference signal $INT_{IN}$. In some cases, the reference signal $INT_{IN}$ may be set to a value to facilitate conversion of analog input signals within a certain range of values (e.g., dependent on application, product requirements, etc.). As an example, in FIG. 7A, the reference signal $INT_{IN}$ is 2.8 V. In an aspect, the reference signal $INT_{IN}$ corresponds to the reference signal $V_{th1}$ in FIG. 5.

An end of the first ramp may be associated with an MSB count. A value of the MSB count may be incremented (e.g., by the MSB counter circuit) according to the first clock. When the signal $INT_{OUT}$ exceeds the reference signal $INT_{IN}$, the comparator output signal transitions from the first state to the second state. The first ramp continues to increase until a start of a next clock cycle (e.g., the next synchronous clock cycle) of the first clock adjacent to and after a clock cycle of the first clock within which the signal $INT_{OUT}$ exceeds the reference signal $INT_{IN}$. For example, the first ramp reaches the reference signal $INT_{IN}$ between a start of a first clock cycle (e.g., associated with an MSB count of 1) and a start of a second clock cycle (e.g., associated with an MSB count of 2) temporally adjacent to the first clock cycle. The MSB counts of the first clock cycle and the second clock cycle are consecutive integers (e.g., MSB count of 1 and 2, respectively). In some cases, a signal level (e.g., a voltage) of the end of the first ramp may be stored.

The first ramp may be started at different times according to a second clock that is faster than the first clock. As such, in some cases, the first clock may be referred to as a coarse clock and the second clock may be referred to as a fine clock. In the graph 700, an input signal provided to the ADC may be of an appropriate value such that the first ramp causes an MSB count of 2 when the start of the first ramp coincides with the start of the MSB counter circuit. As shown in the graph 700, the start of the first ramp may be adjusted to be sooner or later relative to the start of the MSB counter circuit. A ramp time offset (e.g., also referred to simply as a ramp offset) may provide a difference, in number of fine clock steps, between the start of the first ramp and the start of the MSB counter circuit. The first clock (e.g., synchronous clock) is used to facilitate storage (e.g., latching, capture) of a voltage value at an end of the first ramp. Increments in time used to adjust the start of the first ramp may be adjusted using the second clock. In some embodiments, rather than adjusting the start of the first ramp, the start of the first ramp may be fixed and the start of the counter may be adjusted with the second clock. As such, the start of the first ramp may be referred to as the first ramp being started at each of a plurality of time instances relative to a respective start time of the counter.

By adjusting when the first ramp starts, a value/level of the first ramp may be at a different level when the first clock causes the first ramp to stop. The different value of the first ramp (e.g., associated with the MSB count values) is associated with a different value of the second ramp (e.g., associated with the LSB count values). In this regard, as the start of the first ramp changes, the level of the input signal sampled at the end of the first ramp is different, and thus different LSBs are generated during the second ramp (not shown). In the graph 700, there are 8 fine clock steps between each coarse clock or, equivalently, each first ramp offset adjusts the start of the first ramp by ⅛ of an MSB count.

Figure 7B:
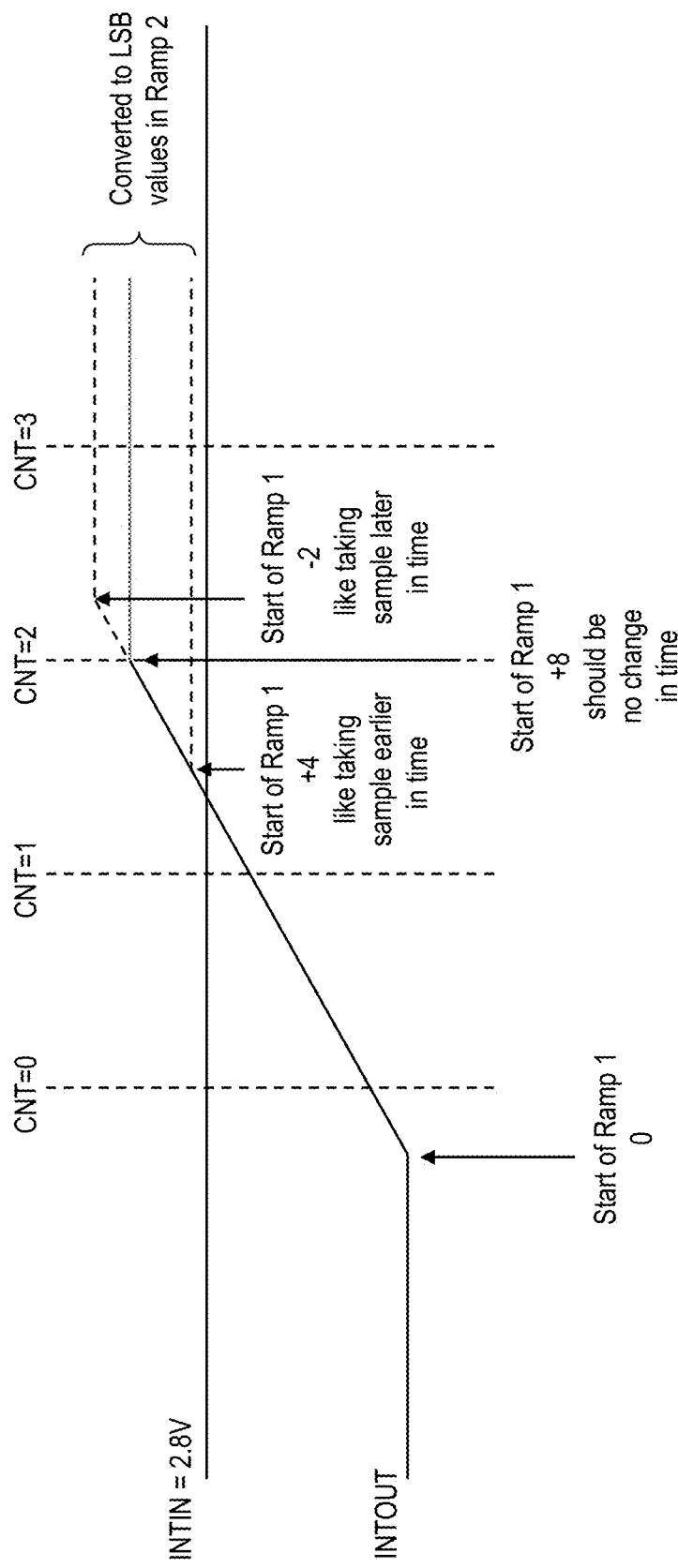
FIG. 7B illustrates another representation of the graph of FIG. 7A in accordance with one or more embodiments of the present disclosure.

Waveforms 705, 710, 715, and 720 are associated with the ramp having a ramp offset of 0, −2 (e.g., earlier by two fine clock steps), +4 (e.g., delayed by four fine clock steps), and +8. Since the end of the first ramp for the waveform 715 is at a lower level than the end of the first ramp for the waveforms 705, 710, and 720, the LSB count value determined during the second ramp associated with the waveform 715 may be higher than the LSB count value associated with the waveforms 705, 710, and 720. For any input signal, adjusting the start of the first ramp by −8 fine clock steps or +8 fine clock steps results in the same sampled value at the end of the first ramp (and thus the same LSB during the second ramp), but offset by one MSB count. For example, the end of the first ramp for the waveforms 705 and 720 has the sampled value, and the MSB count for the waveform 605 is 2 whereas the MSB count for the waveform 620 is 3. As shown in FIG. 7B, starting ramps at different first ramp offsets may be considered as, or may be simulated/implemented by, using appropriate clocks to map out/sample a voltage value of a single first ramp at different points in time.

The change in the first ramp in clock cycles between −8 to +8 ensure that seven different LSB count values may be determined with the same MSB count for any fixed input level. When the first ramp is a linear ramp, any of these two LSB values can be used to determine the slope of the first ramp compared to the slope of the second ramp. As an example, the start of the first ramp may be delayed in increments/steps of 2 ns (e.g., one cycle of a 500 MHz clock) and a clock rate that determines a rate that the LSB counter value changes is 1 count per 1 ns. If the start of the ramp is delayed by 2 ns (e.g., one cycle of the 500 MHz clock) in relation to the MSB counter and synchronous clock, a corresponding change in a voltage stored/saved at the end of the first ramp is (2 ns)(slope$_{RAMP1}$), where slope$_{RAMP1}$ is a slope of the first ramp. This saved voltage level $V_{stored}$ may then be converted to an LSB counter value based on a slope of the second ramp, denoted as slope$_{RAMP2}$, and the clock rate that determines the rate that the LSB counter value changes. Each first ramp offset count (e.g., each increment/step of 2 ns) changes the time that the LSB counter value is saved by $V_{stored}$/slope$_{RAMP2}$. Thus, a total conversion factor from the change in the start of the first ramp by one step size is (2 ns)×(slope$_{RAMP1}$/slope$_{RAMP2}$)×(1 count/1 ns). A ratio of an LSB counter value, denoted as LSB$_{cnt}$, and a first ramp offset count, denoted as R1O$_{cnt}$, may be provided as LSB$_{cnt}$/R1O$_{cnt}$=2(slope$_{RAMP1}$/slope$_{RAMP2}$). Ideally/nominally (e.g., without mismatch such as gain mismatch), slope$_{RAMP1}$/slope$_{RAMP2}$=32 and LSB$_{cnt}$/R1O$_{cnt}$=2(slope$_{RAMP1}$/slope$_{RAMP2}$)=64. As shown in this example, for a given first ramp offset change, the change in the LSB count is proportional to slope$_{RAMP1}$/slope$_{RAMP2}$.

Calibration may be performed to generate a scaling/calibration factor that provides an actual weight of an MSB count to account for mismatches associated with the first ramp and/or second ramp. In this regard, such a scaling/calibration factor provides an indication of how many LSB counts are in an MSB count. Adjusting the start of the first ramp (e.g., as shown in FIG. 7A) by 8 step sizes (e.g., 2 ns per step) is equivalent to the synchronous first ramp clock (e.g., 16 ns per step). In this regard, a clock ratio between the synchronous first ramp clock and the clock associated with the ramp offset is 8. In an example where a full MSB count is associated with eight first ramp offset counts (e.g., as shown in FIG. 7A), the scaling/calibration factor may be provided by scaling factor=(ΔLSB$_{cnt}$/ΔR1O$_{cnt}$)(8). A full eight first ramp offset is associated with the same LSB count value, but offset by one MSB count value. A change of a first ramp offset by less than eight clocks may be scaled to result in a full count.

To determine the step size of an MSB in terms of LSB counts, seven different LSB counts associated with the same MSB value are available. Any two or more of these seven LSB counts may be used (e.g., in a linear case) and scaled to eight step sizes to determine the scaling factor. While any two of these LSB values may be used, use of more than two LSB values (and up to all seven) to determine a best fit curve (e.g., linear or non-linear) may provide better calibrated results. As the difference increases between the speed of the clock adjusting the start of the first ramp and the speed of the synchronous clock associated with incrementing an MSB count, more samples may be taken for the same MSB count to determine a best fit curve. If the first ramp is linear or substantially linear, the LSB points may fit to a line. If the first ramp is not linear, the LSB points may be fit to a polynomial or other function and then scaled to an appropriate number of steps to estimate the MSB step size.

Figure 8:
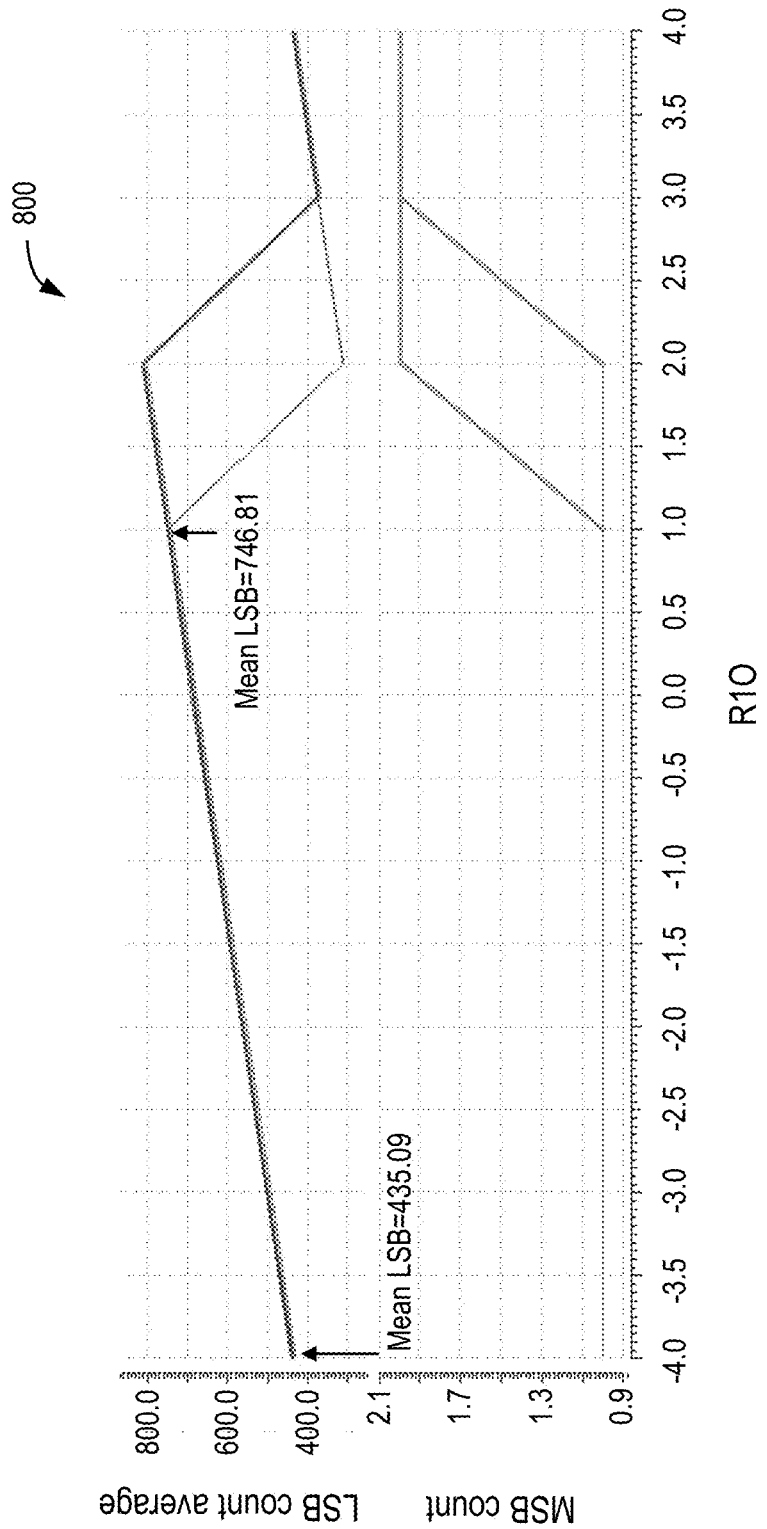
FIG. 8 illustrates a graph with example calibration data used to determine a calibration factor in accordance with one or more embodiments of the present disclosure.

FIG. 8 illustrates a graph 800 with example calibration data used to determine a calibration/scaling factor for a given MSB count in accordance with one or more embodiments of the present disclosure. For explanatory purposes, a clock ratio between a synchronous first ramp clock and a clock associated with a first ramp time offset (denoted as R1O and used to set a start time of the first ramp relative to a start time of an MSB counter) is 8. The first ramp time offset may be swept by −8 clock steps to +8 clock steps. For each clock step, multiple samples may be taken at each clock step (e.g., to average out noise). The first ramp offsets from −4 clock steps to +4 clock steps are shown in the graph 800. The first ramp offsets from −4 clocks to +1 clocks in the graph 800 are associated with samples having an MSB count of 1. Although not shown in the graph 800, first ramp offsets below −4 clocks (e.g., −7, −6, and −5 clocks) may also be associated with the MSB count of 1 and may be associated with lower average count values than the average count values at −4 clocks through +1 clocks.

From the graph 800, an average LSB count value for R1O=−4 is 435.09 and an average LSB count value for R1O=+1 is 746.81. A difference in the average LSB counts, denoted as ΔLSB$_{avg}$, is (746.81−435.09) and a difference in the first ramp offsets, denoted as ΔR1O, is (1−(−4)). From the results shown in the graph 800, a calibration factor associated with the MSB count of 1 may be provided by scaling factor=(ΔLSB$_{avg}$/ΔR1O)(clock ratio)=(746.81−435.09)/[1−(−4)](8)=498.75. In this example, the calibration factor of 498.75 is lower than the nominal weight of 512 LSB counts per 1 MSB count.

Figure 9:
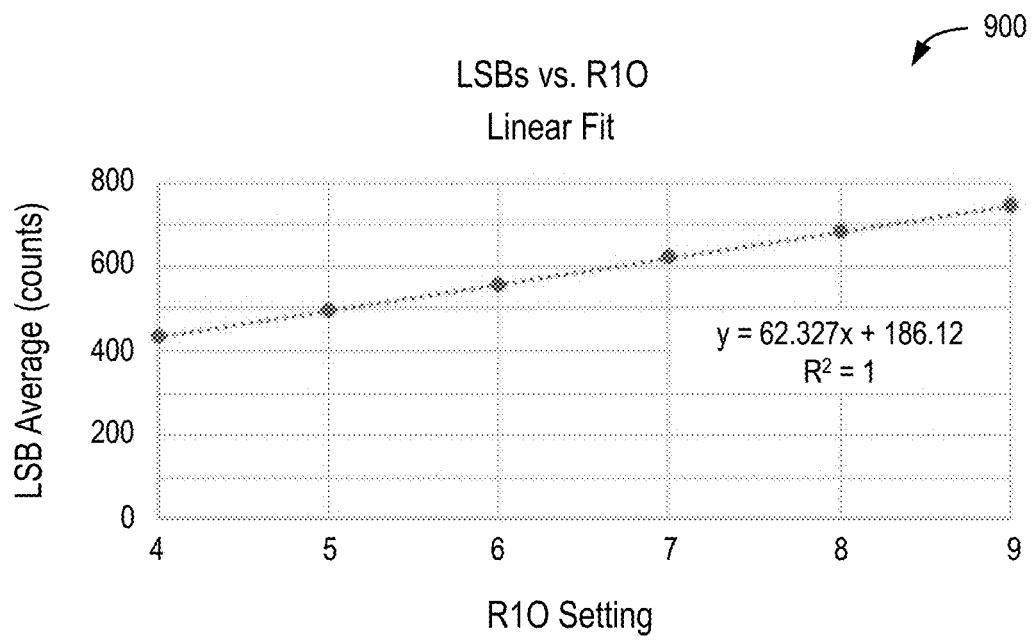
FIG. 9 illustrates a graph in which a best linear fit is determined based on calibration data in accordance with one or more embodiments of the present disclosure.

Although average LSB counts associated with two first ramp offsets are described in the example provided in FIG. 8, more than two average LSB counts may be used. In general, a calibration factor determined using more average LSB counts may provide higher accuracy to compensate for noise and errors (e.g., mismatches) associated with an ADC being calibrated than a calibration factor determined using fewer average LSB counts. As another example, FIG. 9 illustrates a graph 900 in which a best linear fit (e.g., best fit line) is determined using more than two average LSB counts in accordance with one or more embodiments of the present disclosure. From the best linear fit, the slope of 62.327 for the best fit line is multiplied by the clock ratio of 8 to obtain a calibration factor of 498.62. It is noted that the offset (e.g., 186.12) shown in the graph 900 generally does not provide information associated with the calibration factor. The LSB values over an R1O sweep for a given MSB count may provide a check on an accuracy of a global offset applied between the two ramps. An accurate global offset may ensure that LSBs are not railed high or low and are centered within the LSB range.

As shown in FIG. 9, the equation for the best fit line is y=62.327x+186.12, where x is the R1O setting and y is the average LSB counts. To use the equation, a value $y_{MIN}$(R1O=4.0)=LSB$_{MIN}$=62.327(4.0)+186.12=435.428 and a value $y_{MAX}$(R1O=9.0)=LSB$_{MAX}$=62.327(9.0)+186.12=747.063 may be determined from the best fit line. The scaling factor (e.g., MSB weight) may be provided by scaling factor=$[y_{MAX}(R1O=9.0)-y_{MIN}(R1O=4.0)]/(9.0-4.0)(8)=498.616$ by scaling $y_{MAX}(R1O=9.0)-y_{MIN}(R1O=4.0)$ to the full 8 clocks, since there are eight clocks per MSB count and the sampled points span only 5 clocks (e.g., from R1O=9 to R1O=4).

Figure 10:
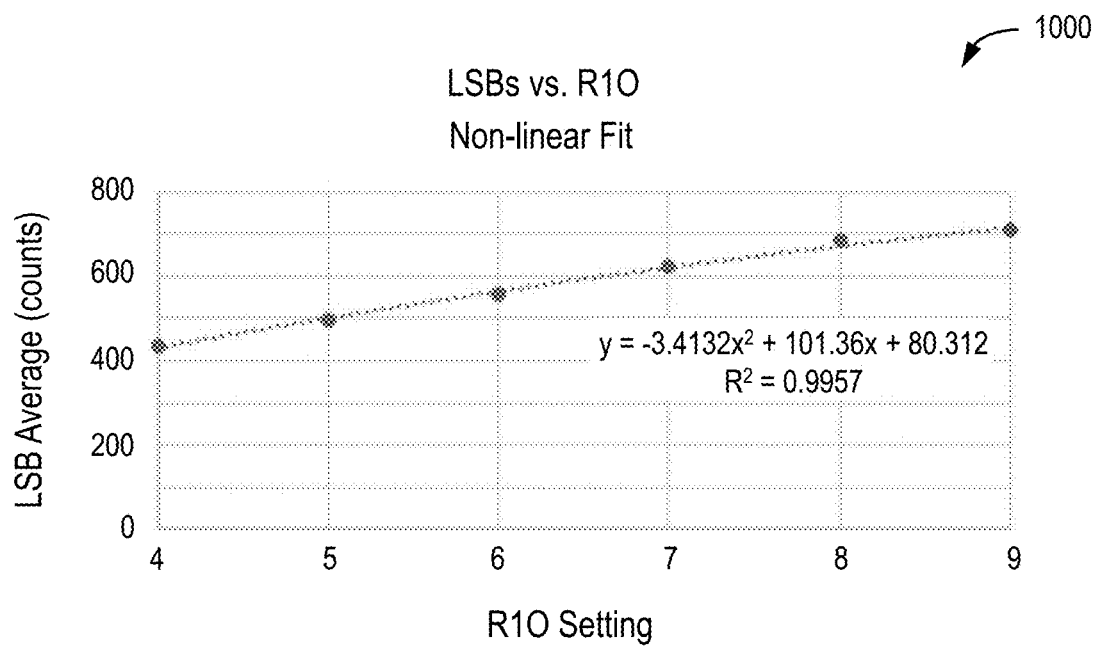
FIG. 10 illustrates a graph in which a non-linear curve is determined based on calibration data in accordance with one or more embodiments of the present disclosure.

As another example, FIG. 10 illustrates a graph 1000 in which a non-linear curve (e.g., a polynomial trend line) is determined using more than two average LSB counts in accordance with one or more embodiments of the present disclosure. The equation for the best fit curve is $y=-3.4132x^2+101.36x+80.312$, where x is the R1O setting and y is the average LSB counts. For this non-linear case, two R1O points that are 8 clocks apart (e.g., due to 8 clocks per MSB count) may be used to determine the scaling factor, since the LSB counts cannot be directly scaled to the full 8 clocks as provided above in the linear situation. As one example, a minimum and a maximum R1O for the same MSB count that are seven R1Os apart that are then offset by 0.5 counts each may be used. Assuming that the sampled data spans from R1O=3.0 to R1O=11.0. R1O endpoints of 3.5 and 11.5 may be used: $y_{MIN}(R1O=3.5)=LSB_{MIN}=-3.4132(3.5)^2+101.36(3.5)+80.312=393.2253$ and $y_{MAX}(R1O=11.5)=LSB_{MAX}=-3.4132(11.5)^2+101.36(11.5)+80.312=794.4413$. The scaling factor (e.g., MSB weight) may be provided by $y_{MAX}(R1O=11.5)-y_{MIN}(R1O=3.5)=401.216$. Alternatively or in addition, R1O endpoints of 4.0 and 12.0 may be used to obtain $y_{MAX}(R1O=12.0)-y_{MIN}(R1O=4.0)=431.1008$. In some cases, the scaling factor may be set to 401.216, 431.1008, and/or an average of these two values.

In generally, a nominally fixed input provided to an ADC is not fixed due to presence of noise. In addition, the ADC itself may generate noise. Multiple samples may be used to reduce an effect of noise. In some cases, such noise may improve resolution of the LSBs as various values that are ideally integer values become, in practice, non-integer values. With multiple samples, an average value for a given setting may be a non-integer value, thus allowing an LSB average value to be a non-integer value and the calibration factor to be a non-integer value. Utilization of a non-integer value for the calibration factor allows for higher resolution relative to integer valued calibration factors.

In some aspects, each MSB count may be associated with a different calibration factor. During calibration, an appropriate input may be provided to the ADC to allow determining of a calibration factor for multiple MSB counts (e.g., some or all of the $2^5$ MSB counts when the MSBs include five bits). In some aspects, calibration may be performed for each column of an imaging device due to variations (e.g., column gain factor variations) in each column of the imaging device. As such, for a L-bit ADC (e.g., 14-bit ADC) associated with N MSB bits (e.g., 5 MSB bits), M LSB bits (e.g., 9 LSB bits), and an extra redundant LSB bit, where L=N+M, using a calibration factor appropriate for a given MSB count and/or a given column, a total count value can be provided by $S_{ADC}=MSB_{cnt}$(scaling factor)$+LSB_{cnt}$. Furthermore, while the foregoing describes applying the calibration factor to MSBs, the calibration factor may instead be appropriated determined and applied to LSBs. In this case, the total count value may be provided by $S_{ADC}=MSB_{cnt}(2^M)+LSB_{cnt}$(scaling factor)$/2^M$. For example, when M=9, each MSB count ideally/nominally has a weight of 512 LSB counts.

Figure 11:
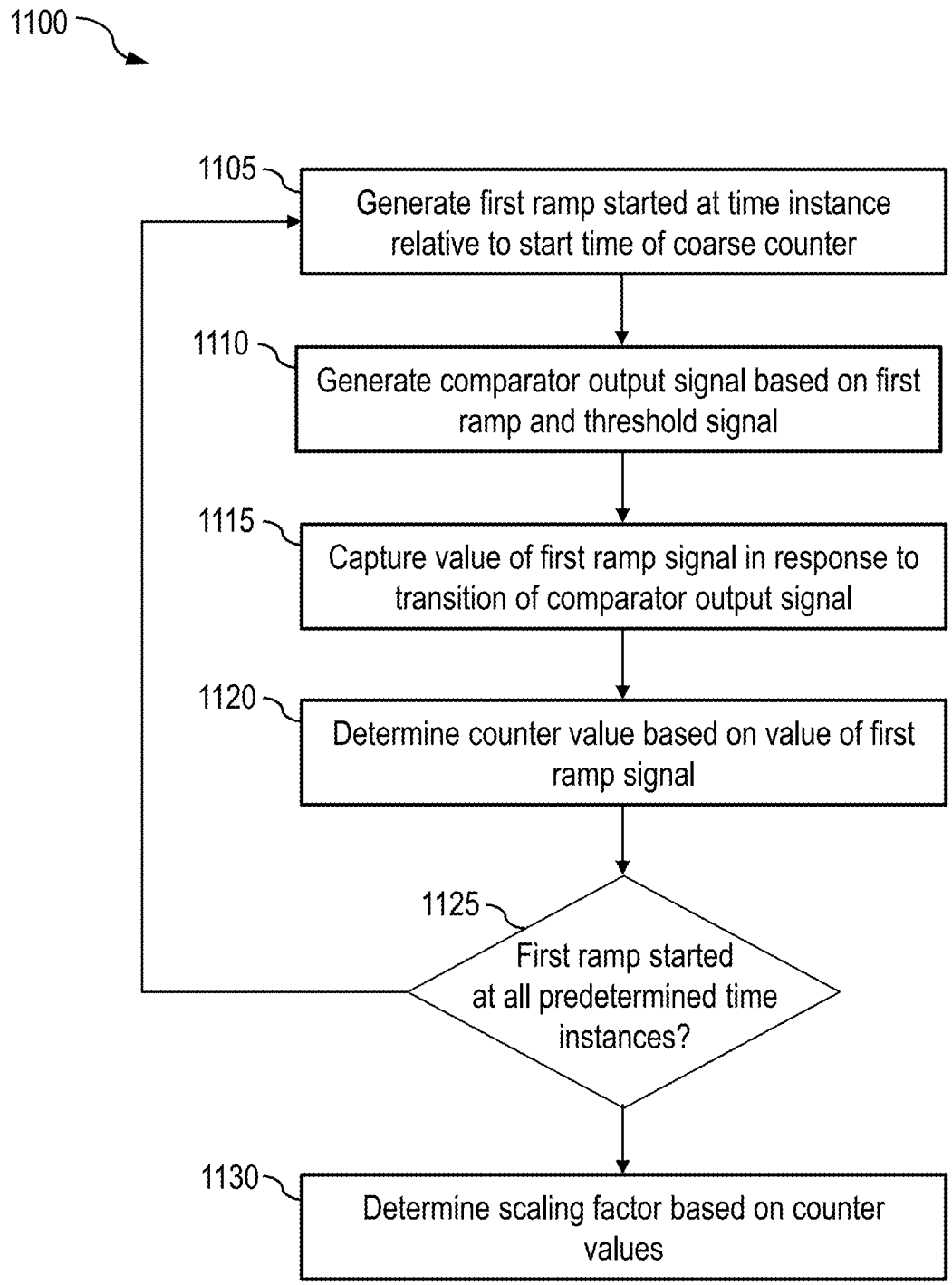
FIG. 11 illustrates a flow diagram of an example process for facilitating analog-to-digital converter calibration in accordance with one or more embodiments of the present disclosure.

FIG. 11 illustrates a flow diagram of an example process 1100 for facilitating ADC calibration in accordance with one or more embodiments of the present disclosure. Although the process 1100 is primarily described herein with reference to various graphs of FIGS. 4-10 and the ADC 300 of FIG. 3 for explanatory purposes, the process 1100 can be performed in relation to other graphs and/or associated ADC architectures. Note that one or more operations in FIG. 11 may be combined, omitted, and/or performed in a different order as desired. In some cases, the operations shown in FIG. 11 may be performed as part of factory calibrations and/or in-the-field calibrations.

At block 1105, an integrator (e.g., one of the integrators 305) and a coarse counter circuit (e.g., the first counter circuit 335) are operated in tandem such that a first ramp signal is started at a time instance relative to a start time of the coarse counter circuit. The ramp signal generated using the generator may be an integrator output signal of the integrator generated in response to receiving a reference signal (e.g., the reference current $I_1$ of the reference generator 350 in FIG. 3) to discharge a capacitor of the integrator. In some cases, the start of the coarse counter circuit may be fixed whereas the start of the first ramp signal may be adjusted (e.g., using a fine clock). In other cases, the start of the first ramp signal may be fixed and the start of the coarse counter circuit may be adjusted (e.g., using the fine clock). The start of the first ramp occurs when the first ramp starts ramping up or ramping down. The start of the counter occurs may a counter value starts to increment or decrement. As an example, in the graph 400, the start of the first ramp occurs when the first ramp starts ramping down at time $t_0+t_1$, and the start of the counter occurs when the counter value starts to increment at time $t_0+t_1$. Prior to time $t_0+t_1$, the integrator may be used to generate an integrator output signal based on an analog input signal to be digitized by the ADC. For block 1105, the start of the first ramp may, but need not, coincide with the start of the counter. In an aspect, an offset between the start of the first ramp and the start of the counter may be referred to as a first ramp offset.

At block 1110, a comparator (e.g., one of the first comparators 310) generates a comparator output signal based on the first ramp signal and a threshold signal (e.g., the reference signal $V_{th1}$). For example, with reference to the graph 500 of FIG. 5, the comparator may generate a comparator output signal at or associated with a first state (e.g., logic low) when a value (e.g., voltage value) of the first ramp signal does not exceed the threshold signal Vail, and the comparator may generate a comparator output signal at or associated with a second state (e.g., logic high) when the value of the first ramp signal exceeds/reaches the threshold signal $V_{th1}$. In this example, the comparator output signal transitions from the first state to the second state once the value of the first ramp signal increases to a level above the threshold signal $V_{th1}$.

At block 1115, a memory (e.g., the memory 330) captures a value of the first ramp signal in response to a transition of the comparator output signal (e.g., from the first state to the second state). With reference to FIG. 7A, when the comparator output signal transitions in value during a clock cycle (e.g., associated with an MSB count), the first ramp signal may continue to increase until a start of a next clock cycle (e.g., associated with a next MSB count). In this regard, the capturing of the value of the first ramp signal occurs according to a clock slower than a clock associated with adjusting a start time of the first ramp signal and/or a start time of the counter.

At block 1120, the ADC determines, based on the value of the first ramp signal captured at block 1115, a fine counter value associated with the first ramp signal started at block 1105. The fine counter value may be determined by using a second ramp signal. The integrator may generate a second ramp signal based on the value of the first ramp captured at block 1115. A fine counter circuit (e.g., the second counter circuit 340) associated with fine counter values may be operated in tandem with the second ramp signal. A clock signal associated with operation of the fine counter circuit is faster than the clock signal associated with operation of the coarse counter circuit. In some cases, a starting value of the second ramp signal may be based on the value of the first ramp captured at block 1115. A comparator (e.g., one of the second comparators 315) may generate a comparator output signal based on the second ramp signal and a threshold signal (e.g., $V_{th2}$ in FIG. 5). With reference to the graph 500 of FIG. 5, the comparator output signal may be at or associated with a first state (e.g., logic low) when a value (e.g., voltage value) of the second ramp signal does not exceed the threshold signal $V_{th2}$, and the comparator output signal may be at or associated with a second state (e.g., logic high) when the value of the second ramp signal exceeds/reaches the threshold signal $V_{th2}$. The memory may capture a fine counter value currently output by the counter circuit in response to a transition of the comparator output signal from the first state to the second state.

At block 1125, a determination is made as to whether the first ramp signal has been started at all predetermined time instances relative to a respective start time of the coarse counter circuit. If the determination is that the first ramp signal has not yet been started at all predetermined time instances, the process 1100 proceeds to block 1105 such that blocks 1105, 1110, 1115, 1120, and 1125 are performed in relation to a next time instance (e.g., a next ramp offset setting).

If the determination is that the first ramp signal has been started at all predetermined time instances, the process 1100 proceeds to block 1130. For explanatory purposes, the fine counter values obtained from the iterations of blocks 1105, 1110, 1115, and 1120 are associated with a coarse counter value (e.g., MSB=1 in FIG. 8) of the coarse counter signal. At block 1130, a logic device (e.g., implemented by the output circuitry 360) determines a scaling factor (e.g., also referred to as a calibration factor) associated with the coarse counter value based on the fine counter values and the plurality of time instances. The scaling factor may be determined by determining a relationship between fine counter values and first ramp offsets, such as shown in FIGS. 8-10.

As provided above, a calibration factor may be determined for each coarse count (e.g., MSB count) and each column of an imaging device (e.g., due to column gain factor variations). As such, in some embodiments, the process 1100 may be performed to determine calibration factors for different columns and/or different coarse counts.

Figure 12:
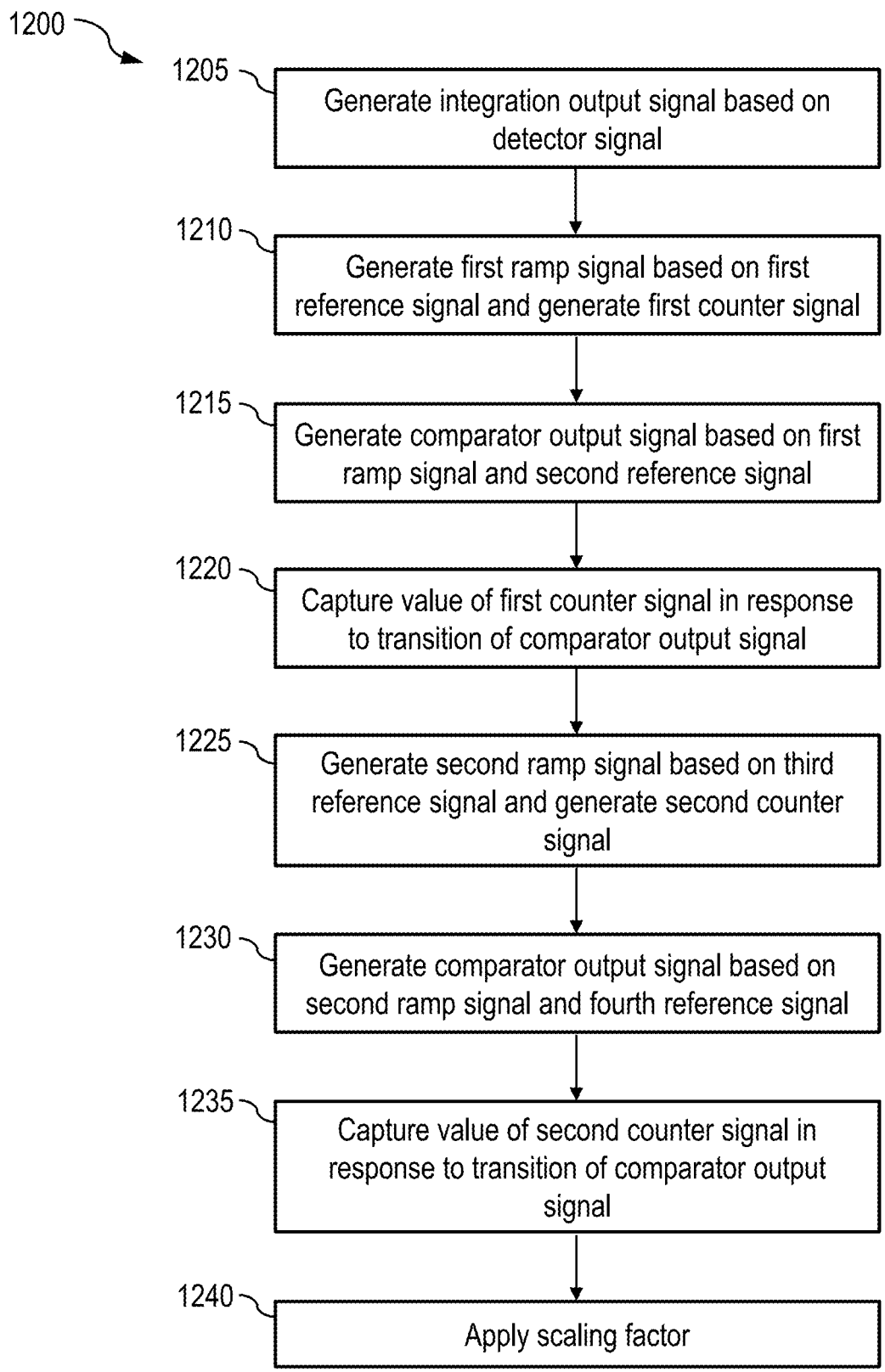
FIG. 12 illustrates a flow diagram of an example process for applying a calibration factor in accordance with one or more embodiments of the present disclosure.

FIG. 12 illustrates a flow diagram of an example process 1200 for applying a scaling factor in accordance with one or more embodiments of the present disclosure. Although the process 1200 is primarily described herein with reference to the ADC 300 of FIG. 3 for explanatory purposes, the process 1100 can be performed in relation to other graphs and/or associated ADC architectures. Note that one or more operations in FIG. 12 may be combined, omitted, and/or performed in a different order as desired.

At block 1205, an integrator (e.g., one of the integrators 305) generates an integration output signal based on a detector signal. At block 1210, the integrator generates a first ramp signal based on a first reference signal (e.g., the current signal $I_1$) and a coarse counter circuit (e.g., the first counter circuit 335) generates a coarse counter signal in tandem with the first ramp signal. At block 1215, a comparator (e.g., one of the first comparators 310) generates a comparator output signal based on the first ramp signal and a reference signal (e.g., $V_{th1}$ in FIG. 3). The comparator output signal may be at a first state (e.g., logic low) when the first ramp signal exceeds the first reference signal and may be at a second state when the first ramp signal does not exceed the first reference signal. At block 1220, a memory (e.g., the memory 330) captures a coarse counter value of the coarse counter signal in response a transition of the comparator output signal from the first state to the second state.

At block 1225, the integrator generates a second ramp signal based on a second reference signal (e.g., the current signal $I_2$) and a fine counter circuit (e.g., the second counter circuit 340) generates a fine counter signal in tandem with the second ramp signal. At block 1230, a comparator (e.g., one of the second comparators 315) generates a comparator output signal based on the second ramp signal and a second reference signal (e.g., ground in FIG. 3). The comparator output signal may be at a first state (e.g., logic low) when the second ramp signal exceeds the second reference signal and may be at a second state when the second ramp signal does not exceed the second reference signal. At block 1235, a memory (e.g., the memory 330) captures a fine counter value of the fine counter signal in response a transition of the comparator output signal from the first state to the second state.

At block 1240, a logic device (e.g., the output circuitry 360) applies the scaling factor (e.g., stored in the memory 330 and/or other memory) to obtain a total count value associated with the detector signal. Dependent on implementation, the scaling factor may be applied to the coarse counter value stored at block 1220 or the fine counter value stored at block 1235. As provided above, a different scaling factor may be determined for each coarse count (e.g., MSB count) and each column of an imaging device (e.g., due to column gain factor variations). As such, in some embodiments, the process 1200 may be performed on a column-by-column basis and with consideration to a coarse count.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. A method comprising:
for each time instance of a plurality of time instances:
generating a first ramp signal started at the time instance relative to a respective start of a first counter signal;
generating a respective first comparator output signal based on the first ramp signal and a first threshold signal, wherein the respective first comparator output signal is associated with a first state or a second state;
capturing a respective first value of the first ramp signal in response to a transition of the respective first comparator output signal from the first state to the second state; and
determining a respective second counter value of a second counter signal based on the respective first value; and
determining a scaling factor based on the second counter values and the plurality of time instances, wherein each of the first values is associated with the same first counter value of the first counter signal.

2. The method of claim 1, further comprising for each time instance of the plurality of time instances:
generating a respective second ramp signal based on the respective first value; and
generating a respective second comparator output signal based on the respective second ramp signal and a second threshold signal, wherein the respective second comparator output signal is associated with a third state or a fourth state,
wherein, for each time instance of the plurality of time instances, the determining the respective second counter value comprises capturing the respective second counter value in response to a transition of the respective second comparator output signal from the third state to the fourth state.

3. The method of claim 1, further comprising determining a best fitting curve based on the second counter values and the plurality of time instances, wherein the scaling factor is based on the best fitting curve.

4. The method of claim 1, wherein the first counter signal is associated with a first clock, and wherein the second counter signal is associated with a second clock having a faster clock speed than the first clock.

5. The method of claim 4, wherein the scaling factor is further based on the first clock and the second clock.

6. The method of claim 5, wherein the scaling factor is based on a ratio of a clock speed of the first clock to a clock speed of the second clock.

7. The method of claim 1, wherein for at least one time instance of the plurality of time instances:
the first comparator output signal transitions from the first state to the second state between a start of a first clock cycle and a start of a second clock cycle temporally adjacent to the first clock cycle,
the respective first value is indicative of a value of the first ramp signal at the start of the second clock cycle, and
the first counter value is associated with the second clock cycle.

8. The method of claim 1, further comprising:
receiving a detector signal; and
determining a digital representation of the detector signal based on the scaling factor.

9. The method of claim 8, wherein the digital representation comprises a coarse count value associated with the first counter signal and a fine count value associated with the second counter signal, the method further comprising:
applying the scaling factor to the coarse count value to obtain a scaled coarse count value; and
generating a total count value associated with the detector signal based on a sum of the scaled coarse count value and the fine count value.

10. The method of claim 8, further comprising:
generating a third ramp signal and a third counter signal synchronous with the third ramp signal;
generating a second comparator output signal based on the third ramp signal and the first threshold signal;
capturing a third count value of the third count signal in response to a transition of the second comparator output signal;
generating a fourth ramp signal and a fourth counter signal synchronous with the fourth ramp signal;
generating a third comparator output signal based on the fourth ramp signal and a second threshold signal;
capturing a fourth count value of the fourth counter signal in response to a transition of the third comparator output signal; and
applying the scaling factor to one of the third count value or the fourth count value, wherein the digital representation is based on the third count value, the fourth count value, and the scaling factor.

11. A system comprising:
an analog-to-digital converter (ADC) configured to:
for each time instance of a plurality of time instances:
generate a first ramp signal started at the time instance relative to a respective start of a first counter signal;
generate a respective first comparator output signal based on the first ramp signal and a first threshold signal, wherein the respective first comparator output signal is associated with a first state or a second state;
capture a respective first value of the first ramp signal in response to a transition of the respective first comparator output signal from the first state to the second state; and
determine a respective second counter value of a second counter signal based on the respective first value; and
a logic device configured to determine a scaling factor based on the second counter values and the plurality of time instances, wherein each of the first values is associated with the same first counter value of the first counter signal.

12. The system of claim 11, wherein:
the ADC is further configured to:
generate a respective second ramp signal based on the respective first value; and
generate a respective second comparator output signal based on the respective second ramp signal and a second threshold signal, wherein the respective second comparator output signal is associated with a third state or a fourth state; and
for each time instance of the plurality of time instances, the ADC is configured to determine the respective second counter value by capturing the respective second counter value in response to a transition of the respective second comparator output signal from the third state to the fourth state.

13. The system of claim 11, wherein the logic device is further configured to determine a best fitting curve based on the second counter values and the plurality of time instances, and wherein the scaling factor is based on the best fitting curve.

14. The system of claim 11, further comprising a clock generator circuit configured to generate a first clock and a second clock, wherein the second clock has a faster clock speed than the first clock, wherein the first counter signal is associated with the first clock, and wherein the second counter signal is associated with the second clock.

15. The system of claim 14, wherein the scaling factor is further based on the first clock and the second clock.

16. The system of claim 11, wherein for at least one time instance of the plurality of time instances:
- the first comparator output signal transitions from the first state to the second state between a start of a first clock cycle and a start of a second clock cycle temporally adjacent to the first clock cycle,
- the respective first value is indicative of a value of the first ramp signal at the start of the second clock cycle, and
- the first counter value is associated with the second clock cycle.

17. The system of claim 16, wherein a third counter value is associated with the first clock cycle, and wherein the first counter value and the third counter value are consecutive integers.

18. The system of claim 11, further comprising an image sensor device configured to receive electromagnetic radiation and generate a detector signal based on the electromagnetic radiation, wherein the logic device is further configured to determine a digital representation of the detector signal based on the scaling factor.

19. The system of claim 18, wherein the digital representation comprises a coarse count value associated with the first counter signal and a fine count value associated with the second counter signal, and wherein the logic device is further configured to:
- apply the scaling factor to the coarse count value to obtain a scaled coarse count value; and
- generate a total count value associated with the detector signal based on a sum of the scaled coarse count value and the fine count value.

20. The system of claim 18, wherein the scaling factor is associated with a column of detectors of the image sensor device.

* * * * *

UNITED STATES PATENT AND TRADEMARK OFFICE
CERTIFICATE OF CORRECTION

| | |
|---|---|
| PATENT NO. | : 11,894,855 B2 |
| APPLICATION NO. | : 17/498720 |
| DATED | : February 6, 2024 |
| INVENTOR(S) | : Brian B. Simolon |

It is certified that error appears in the above-identified patent and that said Letters Patent is hereby corrected as shown below:

In the Specification

Column 16, Line 5, change "signal yin" to --signal $V_{in}$--.

Column 16, Line 33, change "signal/level Vim" to --signal/level $V_{th1}$--.

Column 16, Line 35, change "reference signal 12," to --reference signal $I_2$,--.

Column 16, Line 47, change "integrator receives 12." to --integrator receives $I_2$.--.

Column 16, Line 52, change "receives 12." to --receives $I_2$.--.

Column 18, Line 52, change "detector signal yin." to --detector signal $V_{in}$.--.

Column 18, Line 60, change "detector signal yin" to --detector signal $V_{in}$--.

Column 18, Line 62, change "detector signal yin." to --detector signal $V_{in}$.--.

Column 19, Line 55, change "reference signal $V_{in}$)." to --reference signal $V_{th}$).--.

Column 20, Line 10, change "voltage Vim." to --voltage $V_{th1}$.--.

Column 20, Line 12, change "voltage Vim" to --voltage $V_{th1}$--.

Column 20, Line 62, change "signal yin" to --signal $V_{in}$--.

Column 22, Line 52, change "U.S. patent application Ser. No." to --U.S. Patent Application No.--.

Column 28, Line 43, change "threshold signal Vail," to --threshold signal $V_{th1}$,--.

Signed and Sealed this
Nineteenth Day of March, 2024

*Katherine Kelly Vidal*
*Director of the United States Patent and Trademark Office*